United States Patent
Chu et al.

(10) Patent No.: US 11,149,853 B2
(45) Date of Patent: Oct. 19, 2021

(54) AIRFLOW SEALING BY FLEXIBLE RUBBER WITH I-BEAM AND HONEYCOMB STRUCTURE

(71) Applicant: DELL PRODUCTS L.P., Round Rock, TX (US)

(72) Inventors: Yi-Pai Chu, Taoyuan (TW); Liang-Chun Ma, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 153 days.

(21) Appl. No.: 15/980,282

(22) Filed: May 15, 2018

(65) Prior Publication Data
US 2019/0353249 A1 Nov. 21, 2019

(51) Int. Cl.
F16J 15/08 (2006.01)
H05K 7/20 (2006.01)

(52) U.S. Cl.
CPC ....... F16J 15/0818 (2013.01); F16J 15/0831 (2013.01); H05K 7/20454 (2013.01)

(58) Field of Classification Search
CPC .. F16J 15/0818; F16J 15/0825; F16J 15/0831; H05K 7/20454; F01D 11/127
See application file for complete search history.

(56) References Cited

U.S. PATENT DOCUMENTS

| | | | | |
|---|---|---|---|---|
| 3,046,648 A | * | 7/1962 | Kelly | F16J 15/444 228/181 |
| 3,608,914 A | * | 9/1971 | Harby | F16J 15/122 277/654 |
| 3,659,861 A | * | 5/1972 | Rao | F28D 19/047 277/405 |
| 3,689,971 A | * | 9/1972 | Davidson | B23P 15/006 29/889 |
| 3,903,959 A | * | 9/1975 | Fushimi | F28D 19/047 165/9 |
| 4,218,066 A | * | 8/1980 | Ackermann | F01D 11/02 277/414 |
| 4,295,785 A | * | 10/1981 | Lardellier | F01D 11/02 277/414 |
| 4,416,457 A | * | 11/1983 | McGinnis | F01D 11/12 277/414 |
| 4,423,097 A | * | 12/1983 | Mons | C22C 32/00 277/415 |
| 4,460,185 A | * | 7/1984 | Grandey | F01D 11/122 277/415 |
| 4,721,555 A | * | 1/1988 | Grosshandler | C25B 9/00 204/252 |
| 5,161,945 A | * | 11/1992 | Clevenger | F01D 25/145 415/177 |
| 5,380,153 A | * | 1/1995 | Campbell | B23K 1/0014 277/414 |
| 5,510,069 A | * | 4/1996 | Schuppler | B41M 1/12 264/132 |
| 5,628,520 A | * | 5/1997 | Ueda | F16J 15/104 277/654 |
| 5,765,838 A | * | 6/1998 | Ueda | F16J 15/22 277/580 |

(Continued)

Primary Examiner — Eugene G Byrd
(74) Attorney, Agent, or Firm — Jackson Walker LLP; Christopher J. Rourk

(57) ABSTRACT

A gasket is disclosed that includes an edge structure and a honeycomb structure surrounded by the edge structure.

19 Claims, 41 Drawing Sheets

(56) References Cited

U.S. PATENT DOCUMENTS

| | | | |
|---|---|---|---|
| 7,087,339 B2 * | 8/2006 | Wald | H01M 8/0271 429/483 |
| 9,889,552 B2 | 2/2018 | Escamilla | |
| 9,907,993 B2 | 3/2018 | Penney | |
| 9,909,003 B2 | 3/2018 | Spencer et al. | |
| 9,944,415 B2 | 4/2018 | Lin | |
| 10,011,087 B2 | 7/2018 | Massarelli et al. | |
| 10,046,985 B2 | 8/2018 | Al-Ahmed et al. | |
| 10,053,046 B2 | 8/2018 | Villacres Mesias et al. | |
| 10,093,073 B2 | 10/2018 | Parloo et al. | |
| 10,143,959 B2 | 12/2018 | Meirav et al. | |
| 10,151,152 B2 | 12/2018 | Wight et al. | |
| 10,166,863 B1 | 1/2019 | Herbert et al. | |
| 10,174,200 B2 | 1/2019 | Iwata et al. | |
| 10,183,638 B2 | 1/2019 | Zannier | |
| 10,206,512 B2 | 2/2019 | Kim et al. | |
| 10,240,615 B1 | 3/2019 | Kho et al. | |
| 10,266,231 B2 | 4/2019 | Van De Steene et al. | |
| D862,928 S * | 10/2019 | Klobuchar | D6/595 |
| 2008/0260523 A1 * | 10/2008 | Alvanos | F01D 11/001 415/173.4 |
| 2008/0265512 A1 * | 10/2008 | Beckman | A61B 17/3423 277/301 |
| 2009/0072496 A1 * | 3/2009 | Kim | F16J 15/0818 277/637 |
| 2010/0283211 A1 * | 11/2010 | Meier | F01D 11/127 277/414 |
| 2011/0074113 A1 * | 3/2011 | Cavanaugh | C23C 10/18 277/414 |
| 2013/0341874 A1 * | 12/2013 | Aykanat | F16L 23/18 277/612 |
| 2014/0356241 A1 * | 12/2014 | Uchimura | B01D 53/885 422/179 |
| 2015/0322808 A1 * | 11/2015 | Wulf | B22F 3/1115 277/414 |
| 2016/0017999 A1 * | 1/2016 | Boyd | B29C 39/42 277/651 |
| 2016/0097295 A1 * | 4/2016 | Allen | F01D 11/122 415/173.4 |

* cited by examiner

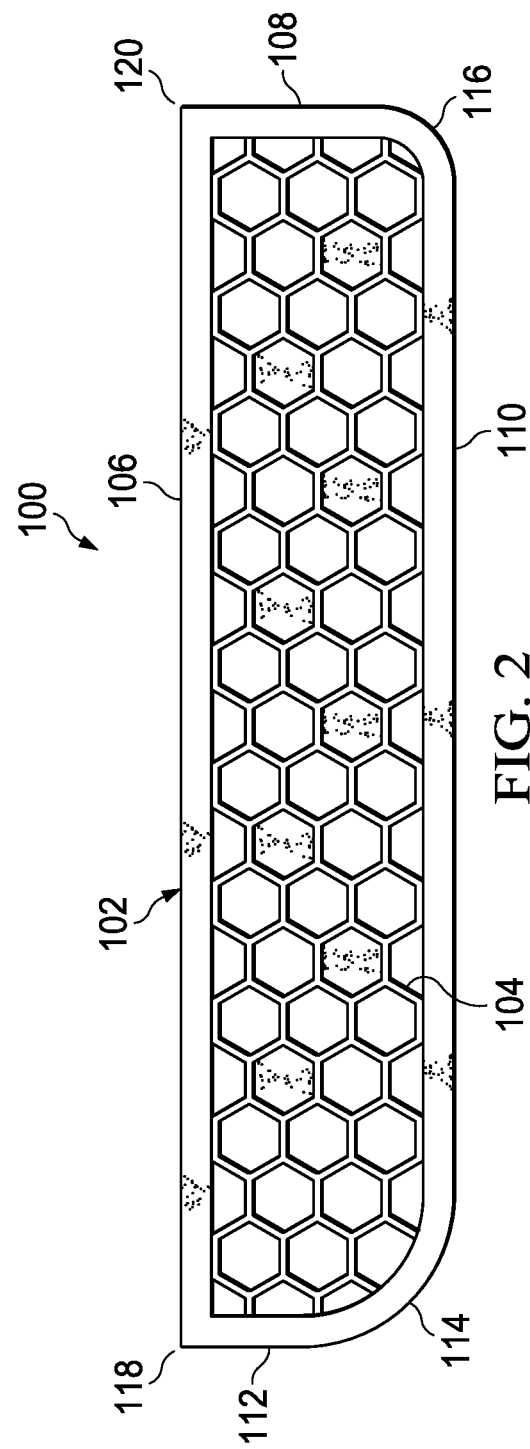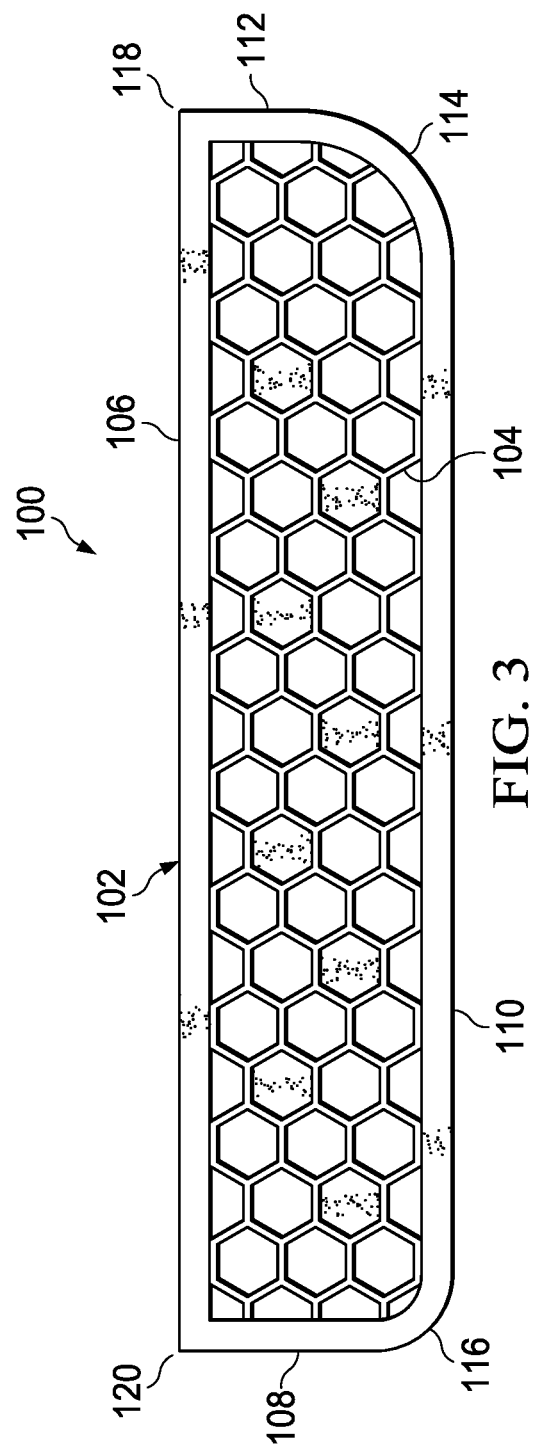

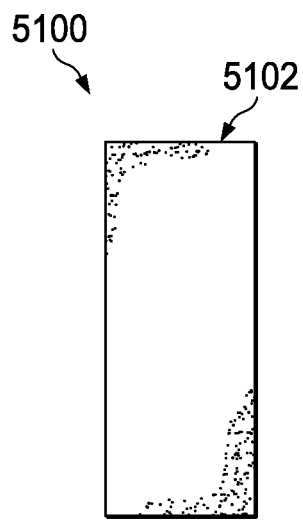 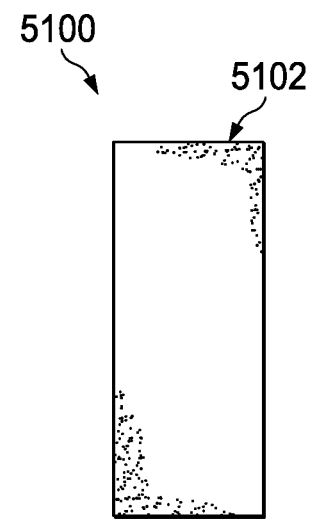
FIG. 54   FIG. 55
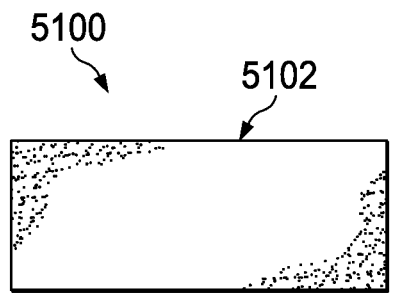
FIG. 56
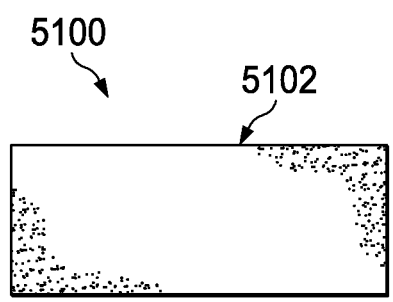
FIG. 57

AIRFLOW SEALING BY FLEXIBLE RUBBER WITH I-BEAM AND HONEYCOMB STRUCTURE

TECHNICAL FIELD

The present disclosure relates generally to gaskets, and more specifically to an airflow sealing gasket that uses a flexible rubber, elastomeric, polymeric or other suitable material that has a novel I-beam and honeycomb structure.

BACKGROUND OF THE INVENTION

Gaskets are typically made from solid assemblies that have undesirable material properties.

SUMMARY OF THE INVENTION

A gasket is disclosed that includes an edge structure and a honeycomb structure surrounded by the edge structure.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which:

FIG. 2 is a diagram of a front view of a gasket with an I-beam structure and reinforced honeycomb support, in accordance with an example embodiment of the present disclosure;

FIG. 3 is a diagram of a rear view of a gasket with an I-beam structure and reinforced honeycomb support, in accordance with an example embodiment of the present disclosure;

FIG. 54 is a diagram of a right view of a square gasket with an I-beam structure, in accordance with an example embodiment of the present disclosure;

FIG. 55 is a diagram of a left view of a square gasket with an I-beam structure, in accordance with an example embodiment of the present disclosure;

FIG. 56 is a diagram of a top view of a square gasket with an I-beam structure, in accordance with an example embodiment of the present disclosure;

FIG. 57 is a diagram of a bottom view of a square gasket with an I-beam structure, in accordance with an example embodiment of the present disclosure;

DETAILED DESCRIPTION OF THE INVENTION

Figure 1:
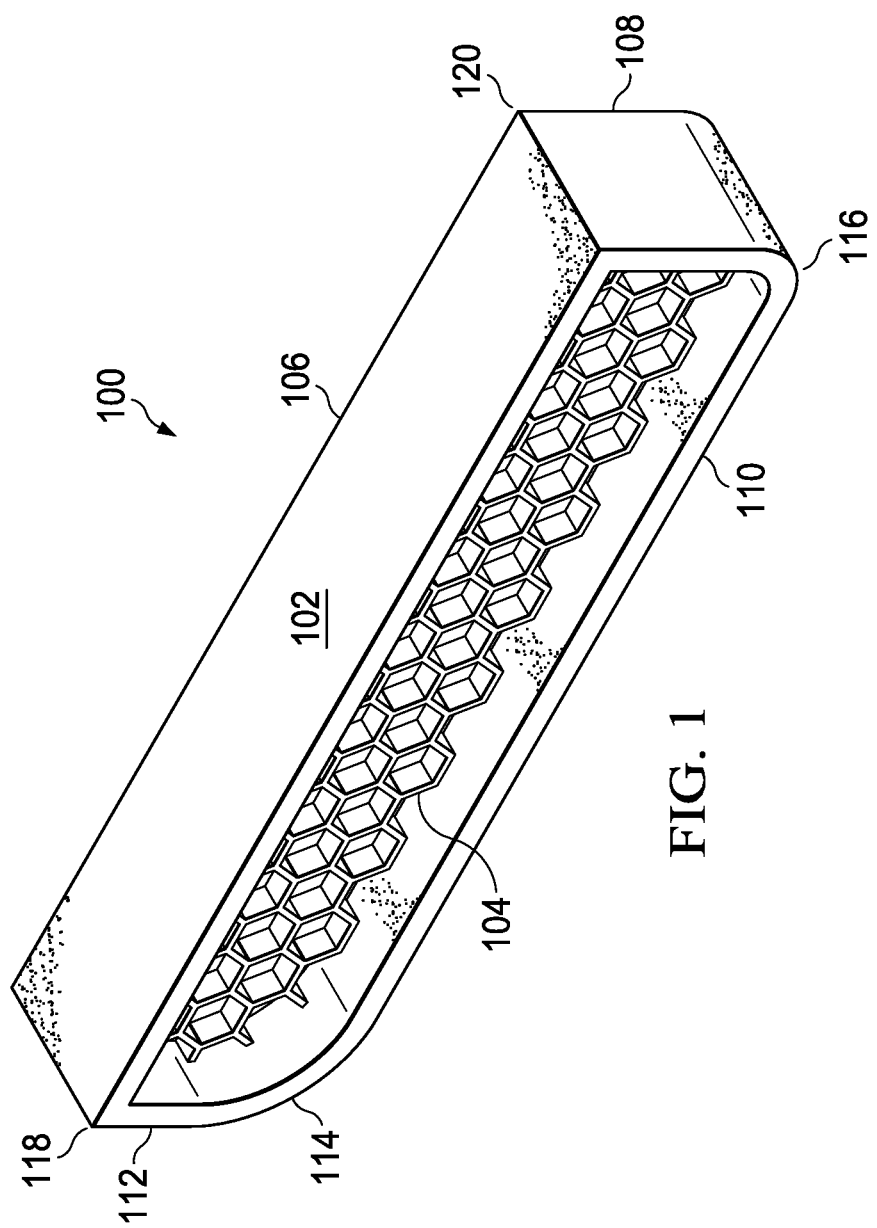
FIG. 1 is an isometric diagram of a gasket with an I-beam structure and reinforced honeycomb support, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

To optimize the thermal cooling in a complex electronic assembly, gaps between equipment should be sealed. Such gaps are typically sealed with a gasket. However, it is often necessary for cables to be routed through such gaps, and existing gaskets fail to provide a substantial seal, which results in substantial coolant leakage through the gaps. The present disclosure provides a gasket having an I-beam and honeycomb structure that provides an improved seal at gaps between equipment when cables are routed through the gaps.

The disclosed gasket can retain its strength when deformed, to accommodate the cables or components passing through a gap. The gap can be reduced at a "minimum" basis for better thermal performance. To optimize the thermal cooling, it is important to seal any gap and leave as small a space as possible, which can be accomplished with the I-beam design, the honeycomb design, by adapting the shape to the design opening, by including penetrations and in other suitable manners.

The disclosed gasket embodiments can be made from solid or sponge rubber, elastomeric, polymer, fluoroelastomer, neoprene, styrene, polyester, silicone or other suitable materials. Areas where cooling is typically deficient include housing assemblies at the sides of a fan gantry and channels where cables pass through a gasket. A bigger gap will induce airflow bypass and recirculation, reduce the efficiency of heat removal, and increase acoustic noise and energy waste.

FIG. 1 is an isometric diagram of gasket 100 with an I-beam structure and reinforced honeycomb support, in accordance with an example embodiment of the present disclosure. Gasket 100 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 100 includes I beam body 102, honeycomb fill 104, top surface 106, side surface 108, bottom surface 110, side surface 112, rounded corner 114, rounded corner 116, square corner 118 and square corner 120, but suitable modifications can be made, such as to have all rounded corners, all square corners, different corner shapes, a combination of corner shapes, thicker or thinner edges, thicker or thinner fill, or other suitable modifications. Gasket 100 can be secured in position with glue, cement, rivets, bolts, clasps or other suitable devices (not explicitly shown).

In general, the I beam body provides an outer surface that extends along the outer boundary of the gasket, where the outer surface has a width W. The I beam body also has a thickness T, where T is usually much less than W. While the exact dimensions of W and T can vary as suitable depending on the material properties of the gasket, the relative ratio of W to T is typically greater than 2:1, and less than 100:1, with a ratio of 3:1 to 7:1 being more common and other ratios being less common, although other suitable ratios can also or alternatively be used. In addition, the honeycomb fill has a width and length that typically extends to the I beam body/outer boundary of the gasket, although a penetration or other opening can be provided that is disposed between the outer boundary of the honeycomb fill at an area and the I beam body, where suitable. However, a sufficient area of contact between the I beam body and the honeycomb fill can be provided to create a structurally-supported assembly, if no other structural support features are provided (such as cross beams, lattices, ribs, supports, or other suitable structures). The honeycomb fill also has a thickness, where the thickness can vary as a function of the honeycomb structure. The honeycomb structure is generally provided for support purposes, but variations in the design of the honeycomb structure can be provided to create identification or ornamental features. The honeycomb can have cells that are triangular, square, pentagonal, hexagonal, heptagonal, octagonal, nonagonal, decagonal or generally n-agonal, including mixtures of different cell types. For example, cell types can be selected to improve structural support in predetermined areas, such as around or between penetrations or at boundaries. Each cell generally has an outer boundary with a thickness Tb, and an interior with a thickness Ti, where Tb>Ti. In addition, while Tb and Ti generally do not have any specific dimensional ranges, the ratio of Tb to Ti is typically greater than 2:1, and less than 10:1, with a ratio of 3:1 to 7:1 being more common and other ratios being less common. Likewise, the ratio of the thickness T of the I beam body to Tb (T:Tb) is typically between 1:3 and 3:1, although other suitable ratios can also or alternatively be used, and the ratio of the width W of the I beam body to Tb (W:Tb) is typically greater than 2:1, and less than 10:1, with a ratio of 3:1 to 7:1 being more common and other ratios being less common, although other suitable ratios can also or alternatively be used.

FIG. 2 is a diagram of a front view of gasket 100 with an I-beam structure and reinforced honeycomb support, in accordance with an example embodiment of the present disclosure.

FIG. 3 is a diagram of a rear view of gasket 100 with an I-beam structure and reinforced honeycomb support, in accordance with an example embodiment of the present disclosure.

Figure 4:
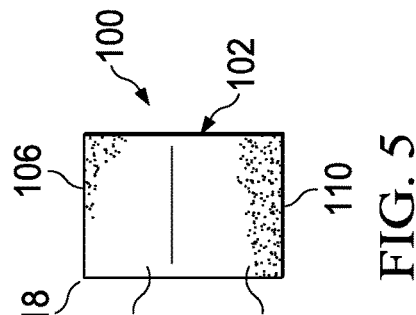
FIG. 4 is a diagram of a right side of a gasket with an I-beam structure and reinforced honeycomb support, in accordance with an example embodiment of the present disclosure.

FIG. 4 is a diagram of a right side of gasket 100 with an I-beam structure and reinforced honeycomb support, in accordance with an example embodiment of the present disclosure.

Figure 5:
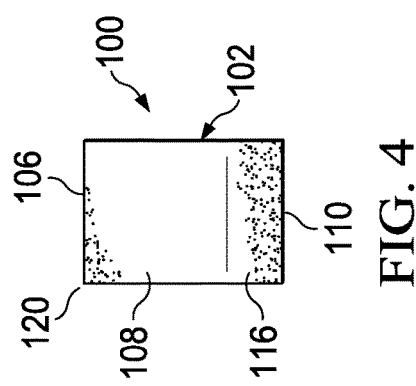
FIG. 5 is a diagram of a left side of a gasket with an I-beam structure and reinforced honeycomb support, in accordance with an example embodiment of the present disclosure.

FIG. 5 is a diagram of a left side of gasket 100 with an I-beam structure and reinforced honeycomb support, in accordance with an example embodiment of the present disclosure.

Figure 6:
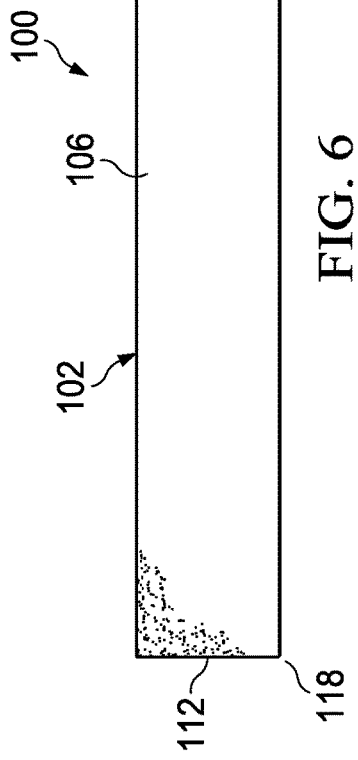
FIG. 6 is a diagram of a top view of a gasket with an I-beam structure and reinforced honeycomb support, in accordance with an example embodiment of the present disclosure.

FIG. 6 is a diagram of a top view of gasket 100 with an I-beam structure and reinforced honeycomb support, in accordance with an example embodiment of the present disclosure.

Figure 7:
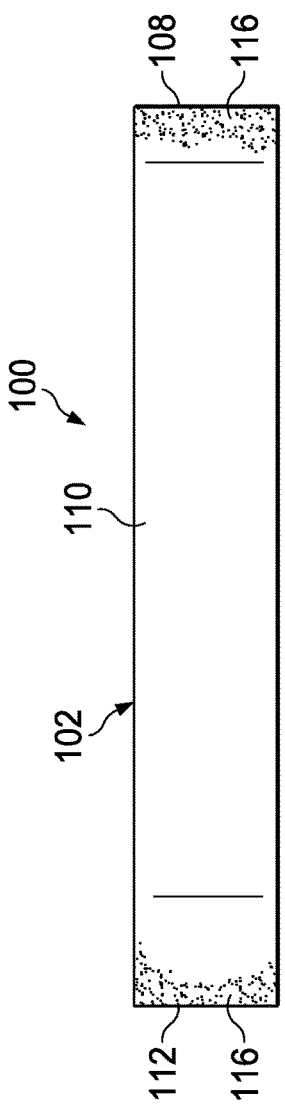
FIG. 7 is a diagram of a bottom view of a gasket with an I-beam structure and reinforced honeycomb support, in accordance with an example embodiment of the present disclosure.

FIG. 7 is a diagram of a bottom view of gasket 100 with an I-beam structure and reinforced honeycomb support, in accordance with an example embodiment of the present disclosure.

Figure 8:
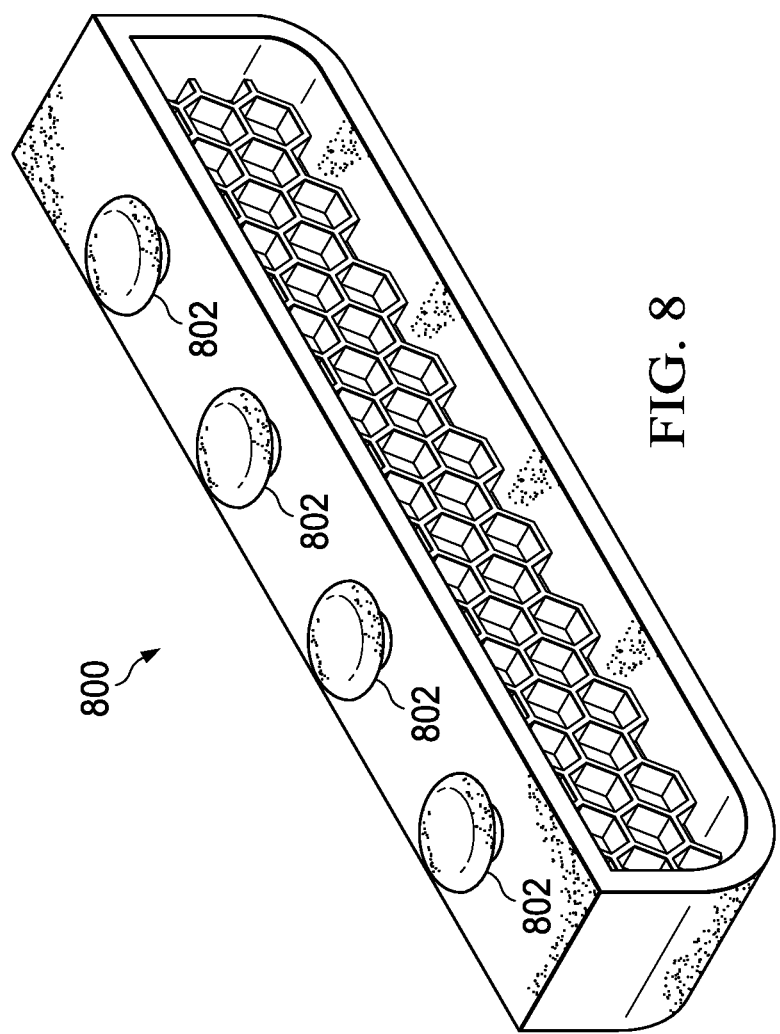
FIG. 8 is a diagram of an alternative perspective view of a gasket with an I-beam structure and reinforced honeycomb support, in accordance with an example embodiment of the present disclosure.

FIG. 8 is a diagram of an alternative perspective view of a gasket 800 with an I-beam structure and reinforced honeycomb support, in accordance with an example embodiment of the present disclosure. Gasket 800 is similar to gasket 100, but includes buttons 802, which can be used to secure gasket 800 to an assembly. Although four buttons 802 are shown on one side of gasket 800, any suitable number of buttons can also or alternatively be used. Likewise, other extrusions can be used instead of buttons, such as slides, bars or other suitable attachment shapes.

Figure 9:
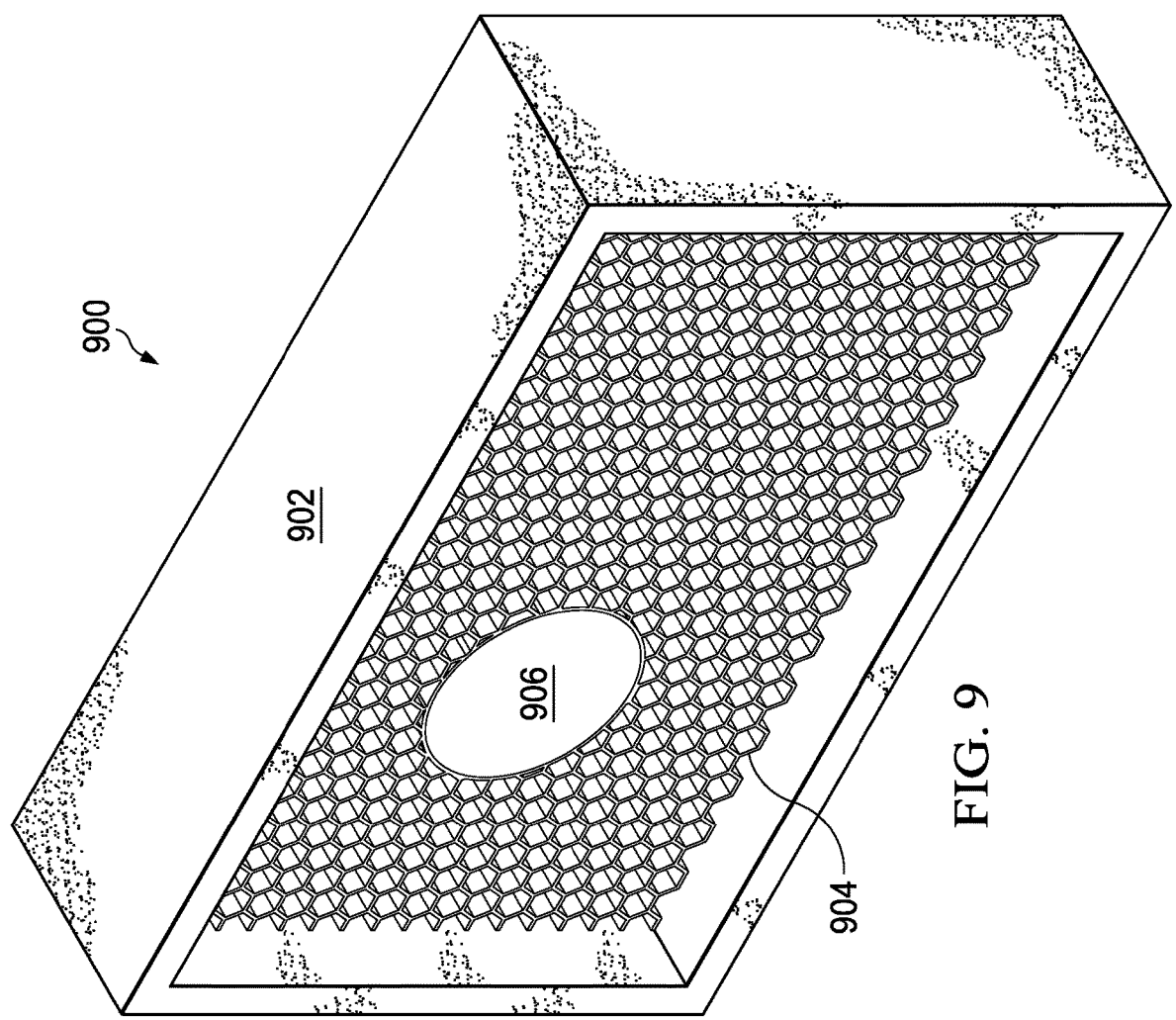
FIG. 9 is a diagram of an isometric diagram of a rectangular gasket with an I-beam structure, reinforced honeycomb support and a round penetration, in accordance with an example embodiment of the present disclosure.

FIG. 9 is a diagram of an isometric diagram of a rectangular gasket 900 with an I-beam structure, reinforced honeycomb support and a round penetration, in accordance with an example embodiment of the present disclosure. Gasket 900 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 900 includes I beam body 902, honeycomb fill 904 and circular penetration 906, as well as surfaces similar to those of gasket 100. In addition, suitable modifications can be made to gasket 900 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 900 can be secured in position with glue, cement, rivets, bolts, clasps or other suitable devices (not explicitly shown).

Figure 10:
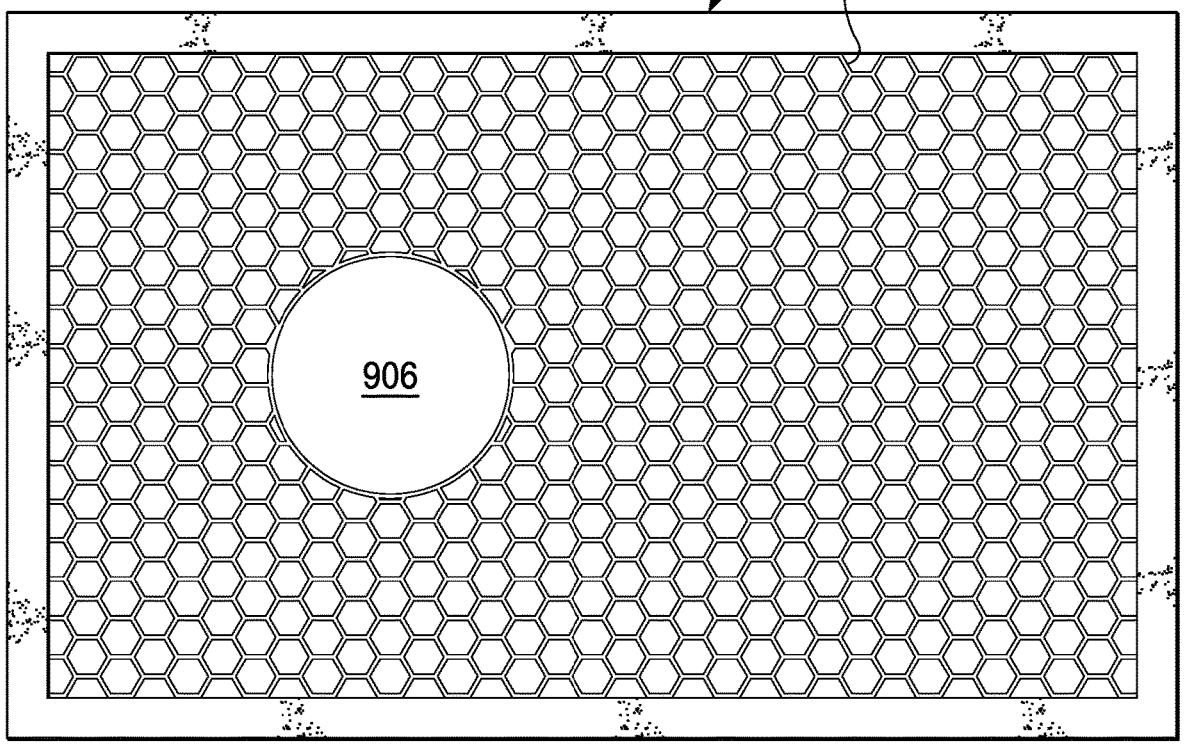
FIG. 10 is a diagram of a front view of a rectangular gasket with an I-beam structure, reinforced honeycomb support and a round penetration, in accordance with an example embodiment of the present disclosure.

FIG. 10 is a diagram of a front view of rectangular gasket 900 with an I-beam structure, reinforced honeycomb support and a round penetration, in accordance with an example embodiment of the present disclosure.

Figure 11:
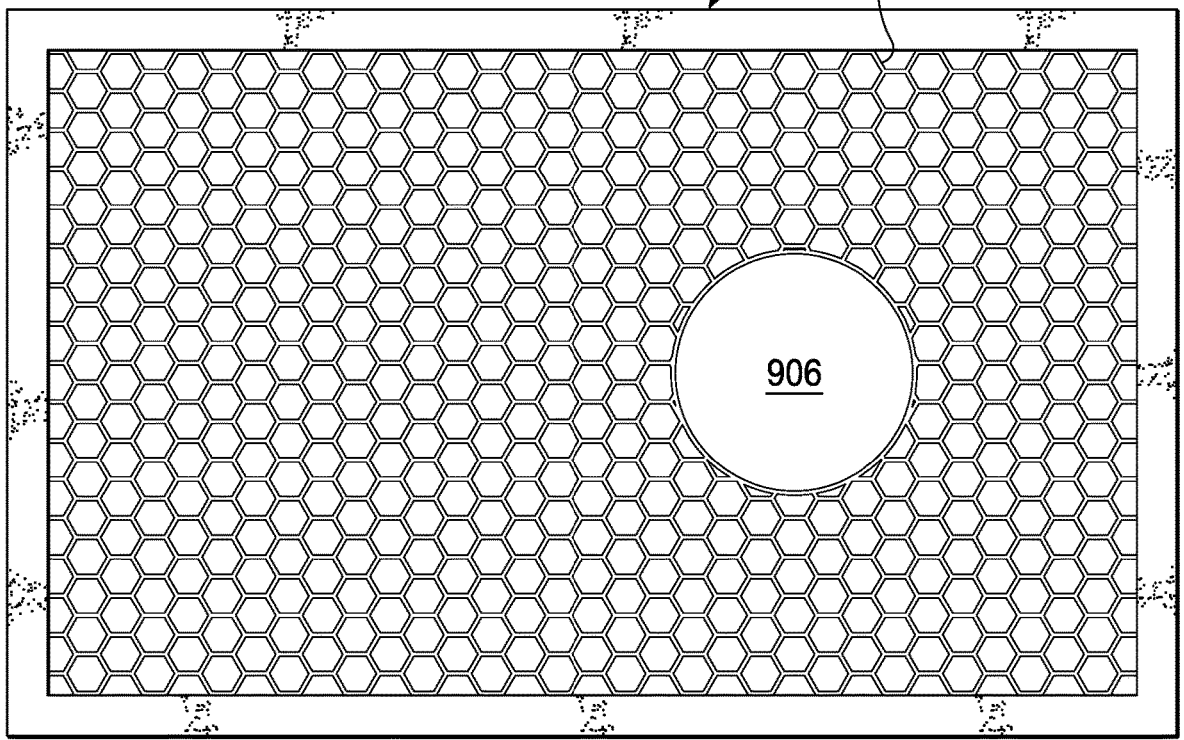
FIG. 11 is a diagram of a rear view of a rectangular gasket with an I-beam structure, reinforced honeycomb support and a round penetration, in accordance with an example embodiment of the present disclosure.

FIG. 11 is a diagram of a rear view of rectangular gasket 900 with an I-beam structure, reinforced honeycomb support and a round penetration, in accordance with an example embodiment of the present disclosure.

Figure 12:
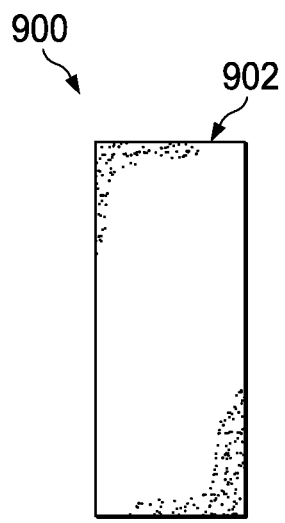
FIG. 12 is a diagram of a right view of a rectangular gasket with an I-beam structure, reinforced honeycomb support and a round penetration, in accordance with an example embodiment of the present disclosure.

FIG. 12 is a diagram of a right view of rectangular gasket 900 with an I-beam structure, reinforced honeycomb support and a round penetration, in accordance with an example embodiment of the present disclosure.

Figure 13:
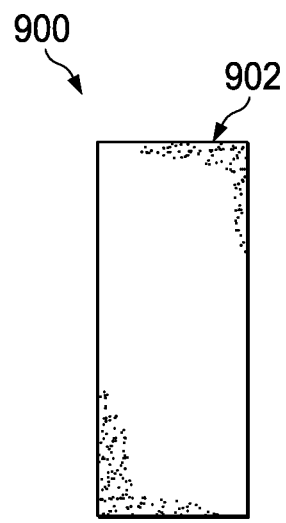
FIG. 13 is a diagram of a left view of a rectangular gasket with an I-beam structure, reinforced honeycomb support and a round penetration, in accordance with an example embodiment of the present disclosure.

FIG. 13 is a diagram of a left view of rectangular gasket 900 with an I-beam structure, reinforced honeycomb support and a round penetration, in accordance with an example embodiment of the present disclosure.

Figure 14:
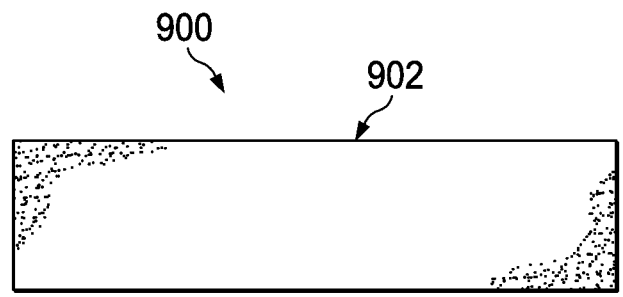
FIG. 14 is a diagram of a top view of a rectangular gasket with an I-beam structure, reinforced honeycomb support and a round penetration, in accordance with an example embodiment of the present disclosure.

FIG. 14 is a diagram of a top view of rectangular gasket 900 with an I-beam structure, reinforced honeycomb support and a round penetration, in accordance with an example embodiment of the present disclosure.

Figure 15:
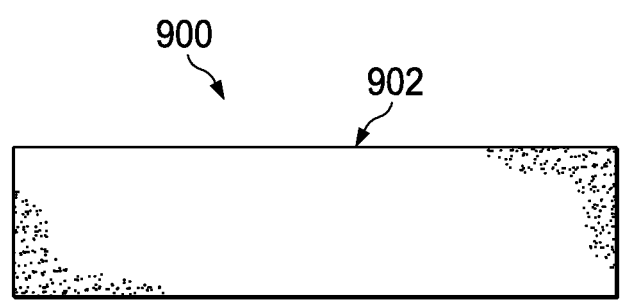
FIG. 15 is a diagram of a bottom view of a rectangular gasket with an I-beam structure, reinforced honeycomb support and a round penetration, in accordance with an example embodiment of the present disclosure.

FIG. 15 is a diagram of a bottom view of a rectangular gasket 900 with an I-beam structure, reinforced honeycomb support and a round penetration, in accordance with an example embodiment of the present disclosure.

Figure 16:
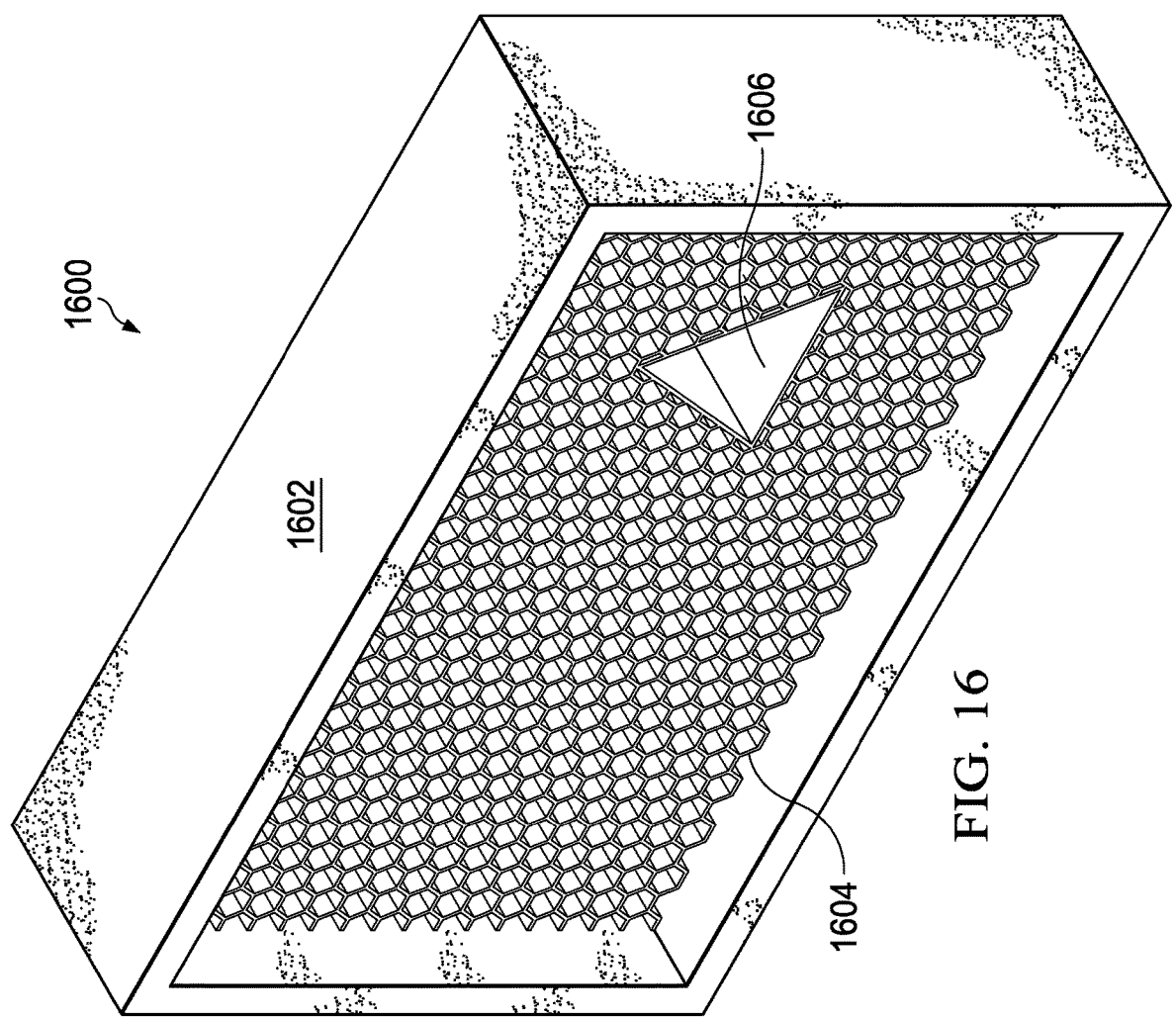
FIG. 16 is a diagram of an isometric diagram of a rectangular gasket with an I-beam structure, reinforced honeycomb support and a triangular penetration, in accordance with an example embodiment of the present disclosure.

FIG. 16 is a diagram of an isometric diagram of a rectangular gasket 1600 with an I-beam structure, reinforced honeycomb support and a triangular penetration, in accordance with an example embodiment of the present disclosure. Gasket 1600 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 1600 includes I beam body 1602, honeycomb fill 1604 and triangular penetration 1606, as well as surfaces similar to those of gasket 100. In addition, suitable modifications can be made to gasket 1600 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 1600 can be secured in position with glue, cement, rivets, bolts, clasps or other suitable devices (not explicitly shown).

Figure 17:
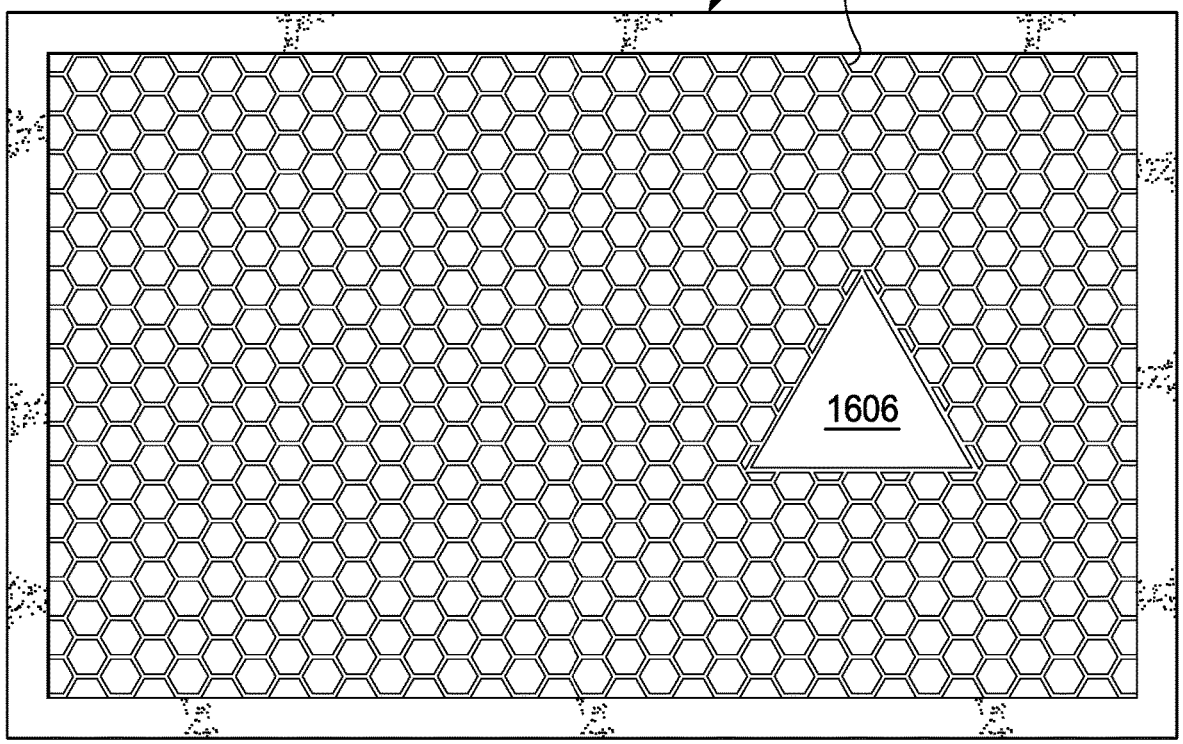
FIG. 17 is a diagram of a front view of a rectangular gasket with an I-beam structure, reinforced honeycomb support and a triangular penetration, in accordance with an example embodiment of the present disclosure.

FIG. 17 is a diagram of a front view of rectangular gasket 1600 with an I-beam structure, reinforced honeycomb support and a triangular penetration, in accordance with an example embodiment of the present disclosure.

Figure 18:
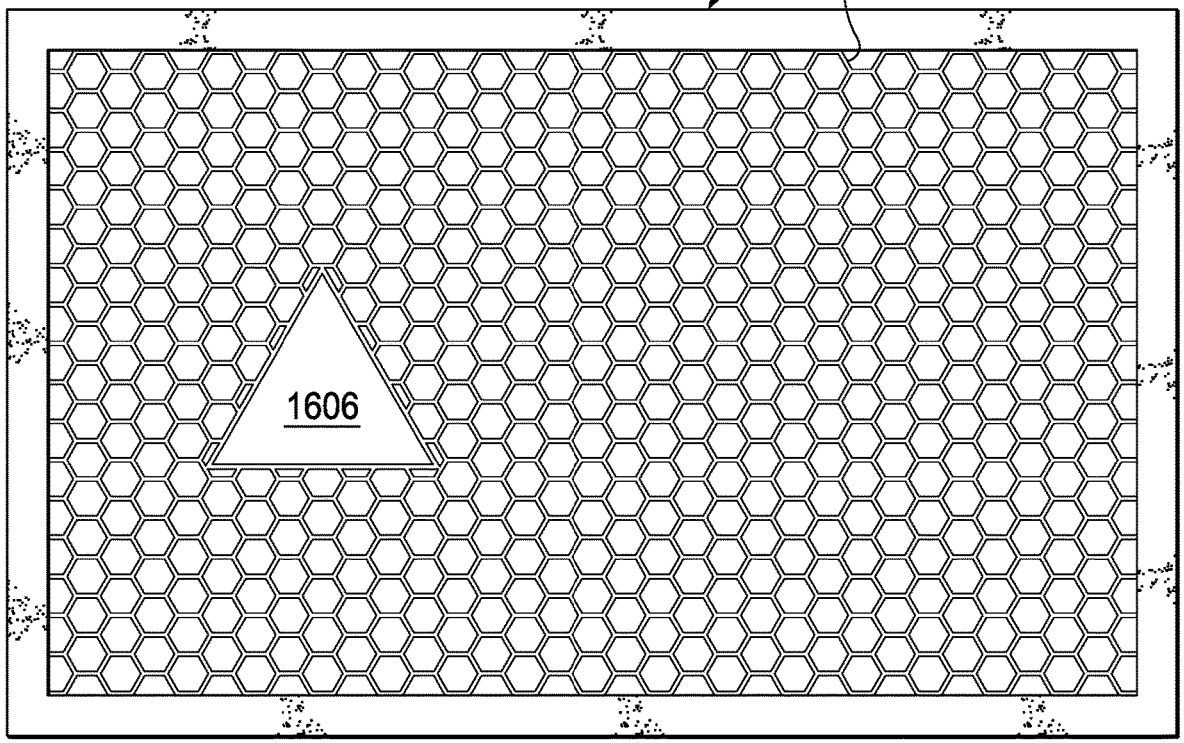
FIG. 18 is a diagram of a rear view of a rectangular gasket with an I-beam structure, reinforced honeycomb support and a triangular penetration, in accordance with an example embodiment of the present disclosure.

FIG. 18 is a diagram of a rear view of rectangular gasket 1600 with an I-beam structure, reinforced honeycomb support and a triangular penetration, in accordance with an example embodiment of the present disclosure.

Figure 19:
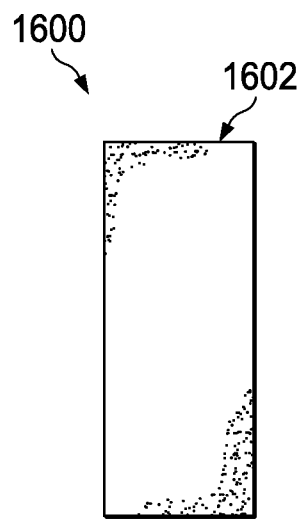
FIG. 19 is a diagram of a right side view of a rectangular gasket with an I-beam structure, reinforced honeycomb support and a triangular penetration, in accordance with an example embodiment of the present disclosure.

FIG. 19 is a diagram of a right side view of rectangular gasket 1600 with an I-beam structure, reinforced honeycomb support and a triangular penetration, in accordance with an example embodiment of the present disclosure.

Figure 20:
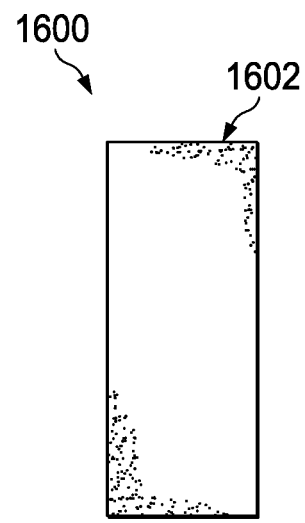
FIG. 20 is a diagram of a left side view of a rectangular gasket with an I-beam structure, reinforced honeycomb support and a triangular penetration, in accordance with an example embodiment of the present disclosure.

FIG. 20 is a diagram of a left side view of rectangular gasket 1600 with an I-beam structure, reinforced honeycomb support and a triangular penetration, in accordance with an example embodiment of the present disclosure.

Figure 21:
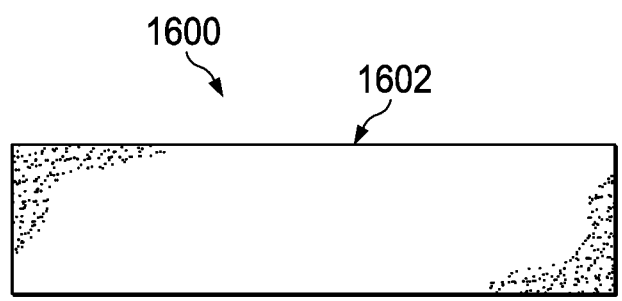
FIG. 21 is a diagram of a top view of a rectangular gasket with an I-beam structure, reinforced honeycomb support and a triangular penetration, in accordance with an example embodiment of the present disclosure.

FIG. 21 is a diagram of a top view of rectangular gasket 1600 with an I-beam structure, reinforced honeycomb support and a triangular penetration, in accordance with an example embodiment of the present disclosure.

Figure 22:
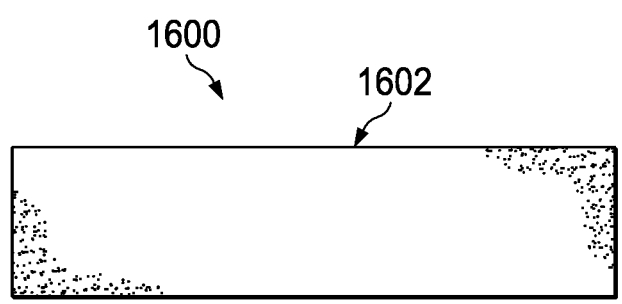
FIG. 22 is a diagram of a bottom view of a rectangular gasket with an I-beam structure, reinforced honeycomb support and a triangular penetration, in accordance with an example embodiment of the present disclosure.

FIG. 22 is a diagram of a bottom view of rectangular gasket 1600 with an I-beam structure, reinforced honeycomb support and a triangular penetration, in accordance with an example embodiment of the present disclosure.

Figure 23:
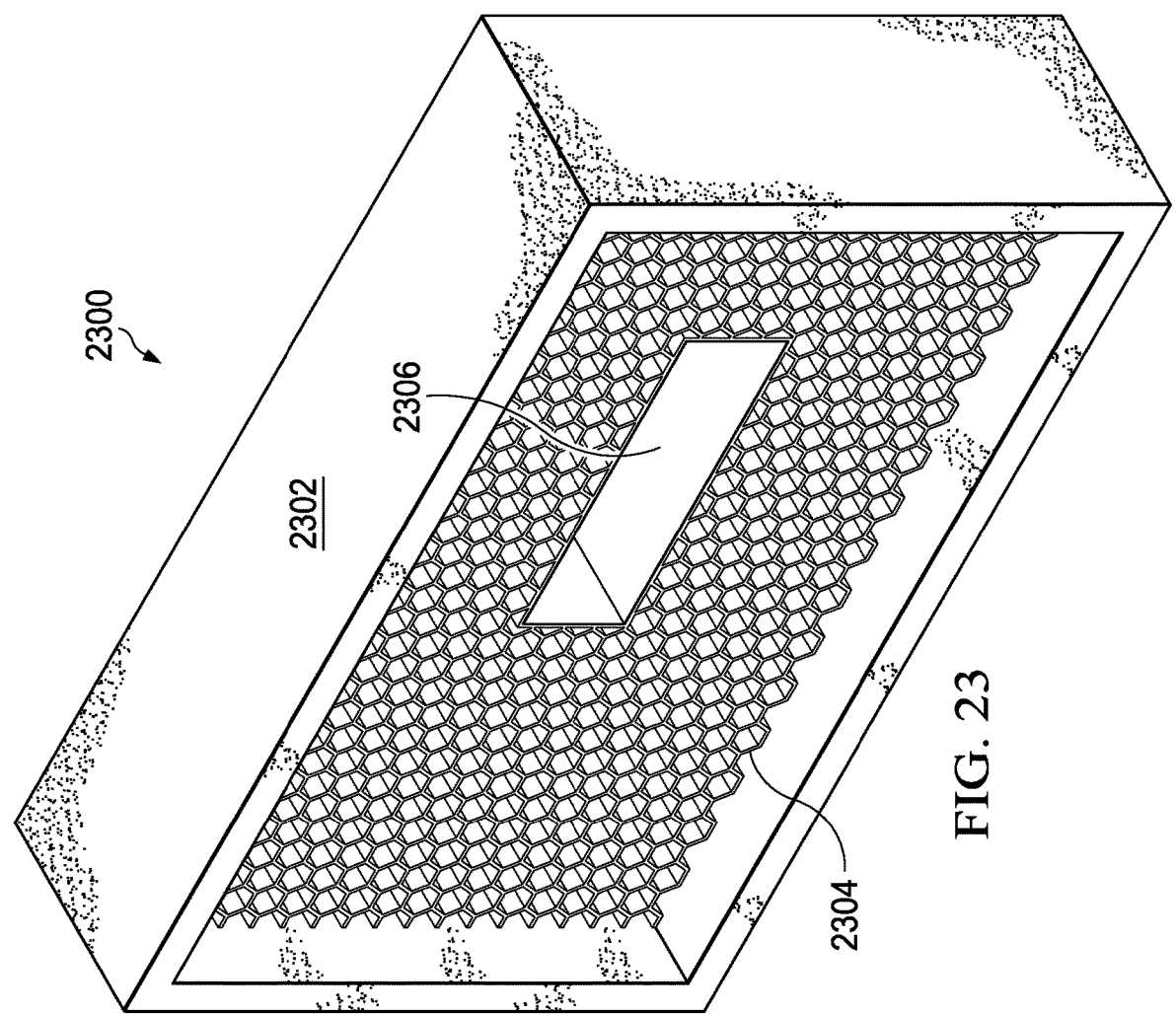
FIG. 23 is a diagram of an isometric diagram of a rectangular gasket with an I-beam structure, reinforced honeycomb support and a rectangular penetration, in accordance with an example embodiment of the present disclosure.

FIG. 23 is a diagram of an isometric diagram of a rectangular gasket 2300 with an I-beam structure, reinforced honeycomb support and a rectangular penetration, in accordance with an example embodiment of the present disclosure. Gasket 2300 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 2300 includes I beam body 2302, honeycomb fill 2304 and rectangular penetration 2306, as well as surfaces similar to those of gasket 100. In addition, suitable modifications can be made to gasket 2300 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 2300 can be secured in position with glue, cement, rivets, bolts, clasps or other suitable devices (not explicitly shown).

Figure 24:
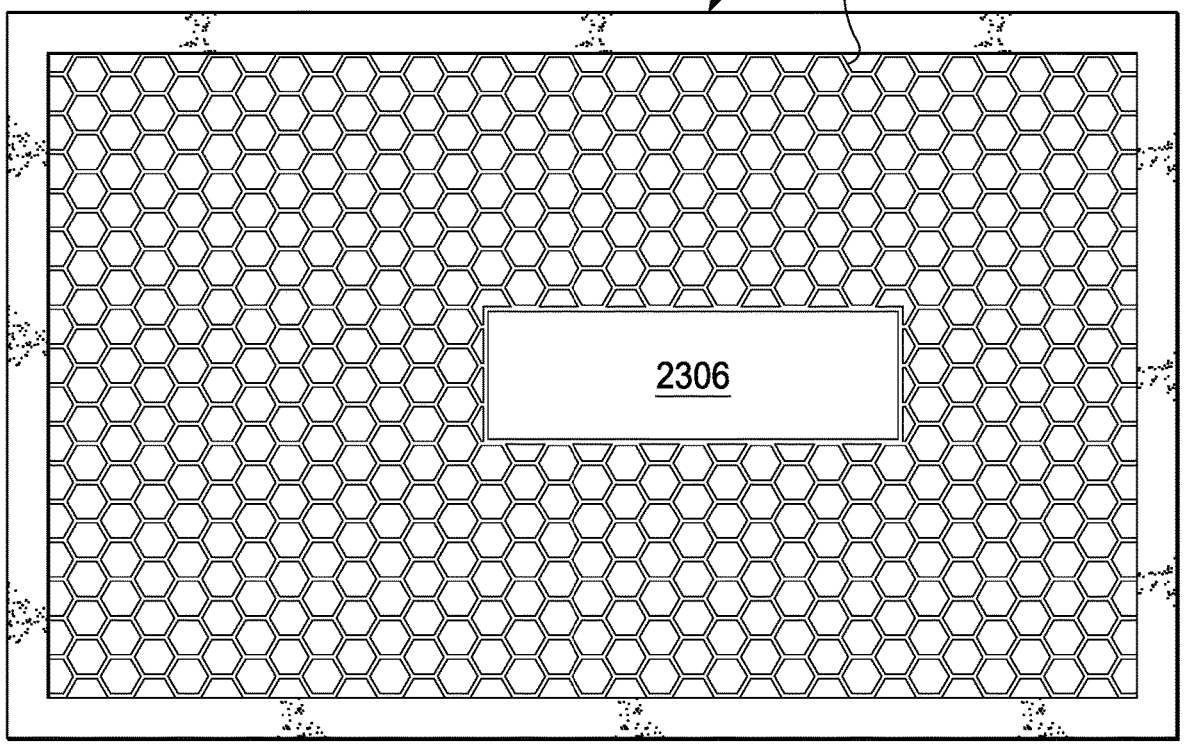
FIG. 24 is a diagram of a front view of a rectangular gasket with an I-beam structure, reinforced honeycomb support and a rectangular penetration, in accordance with an example embodiment of the present disclosure.

FIG. 24 is a diagram of a front view of rectangular gasket 2300 with an I-beam structure, reinforced honeycomb support and a rectangular penetration, in accordance with an example embodiment of the present disclosure.

Figure 25:
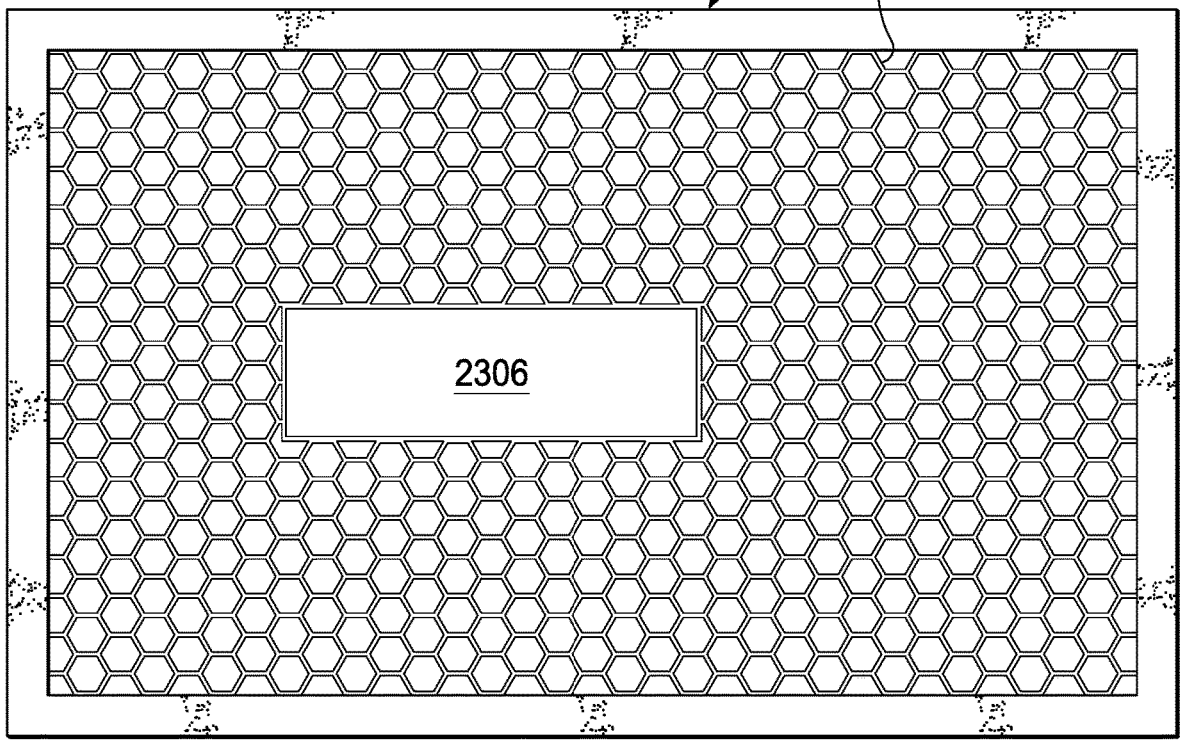
FIG. 25 is a diagram of a rear view of a rectangular gasket with an I-beam structure, reinforced honeycomb support and a rectangular penetration, in accordance with an example embodiment of the present disclosure.

FIG. 25 is a diagram of a rear view of rectangular gasket 2300 with an I-beam structure, reinforced honeycomb support and a rectangular penetration, in accordance with an example embodiment of the present disclosure.

Figure 26:
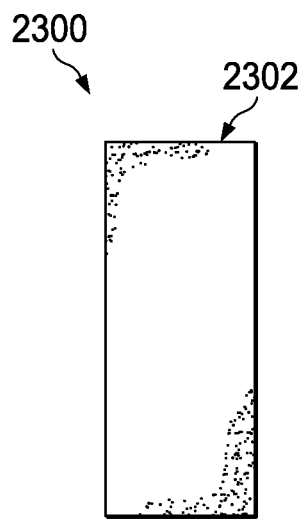
FIG. 26 is a diagram of a right view of a rectangular gasket with an I-beam structure, reinforced honeycomb support and a rectangular penetration, in accordance with an example embodiment of the present disclosure.

FIG. 26 is a diagram of a right view of rectangular gasket 2300 with an I-beam structure, reinforced honeycomb support and a rectangular penetration, in accordance with an example embodiment of the present disclosure.

Figure 27:
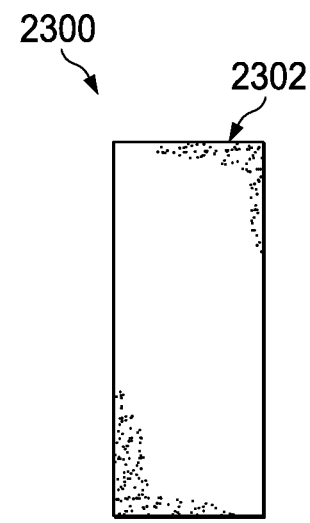
FIG. 27 is a diagram of a left view of a rectangular gasket with an I-beam structure, reinforced honeycomb support and a rectangular penetration, in accordance with an example embodiment of the present disclosure.

FIG. 27 is a diagram of a left view of rectangular gasket 2300 with an I-beam structure, reinforced honeycomb support and a rectangular penetration, in accordance with an example embodiment of the present disclosure.

Figure 28:
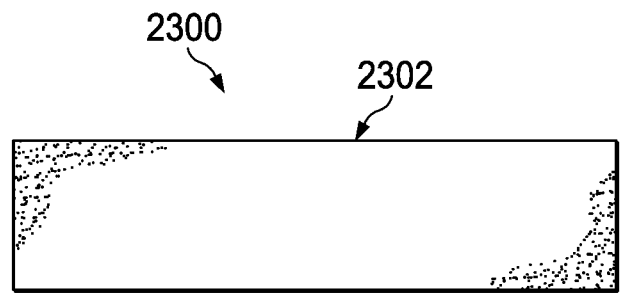
FIG. 28 is a diagram of a top view of a rectangular gasket with an I-beam structure, reinforced honeycomb support and a rectangular penetration, in accordance with an example embodiment of the present disclosure.

FIG. 28 is a diagram of a top view of rectangular gasket 2300 with an I-beam structure, reinforced honeycomb support and a rectangular penetration, in accordance with an example embodiment of the present disclosure.

Figure 29:
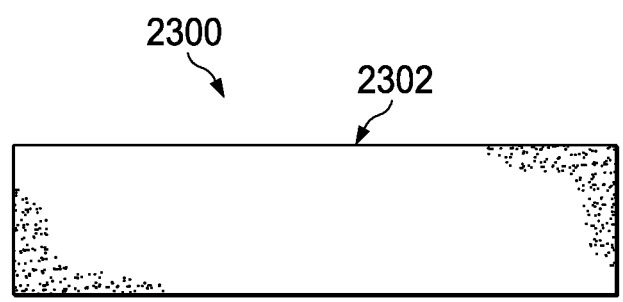
FIG. 29 is a diagram of a bottom view of a rectangular gasket with an I-beam structure, reinforced honeycomb support and a rectangular penetration, in accordance with an example embodiment of the present disclosure.

FIG. 29 is a diagram of a bottom view of rectangular gasket 2300 with an I-beam structure, reinforced honeycomb support and a rectangular penetration, in accordance with an example embodiment of the present disclosure.

Figure 30:
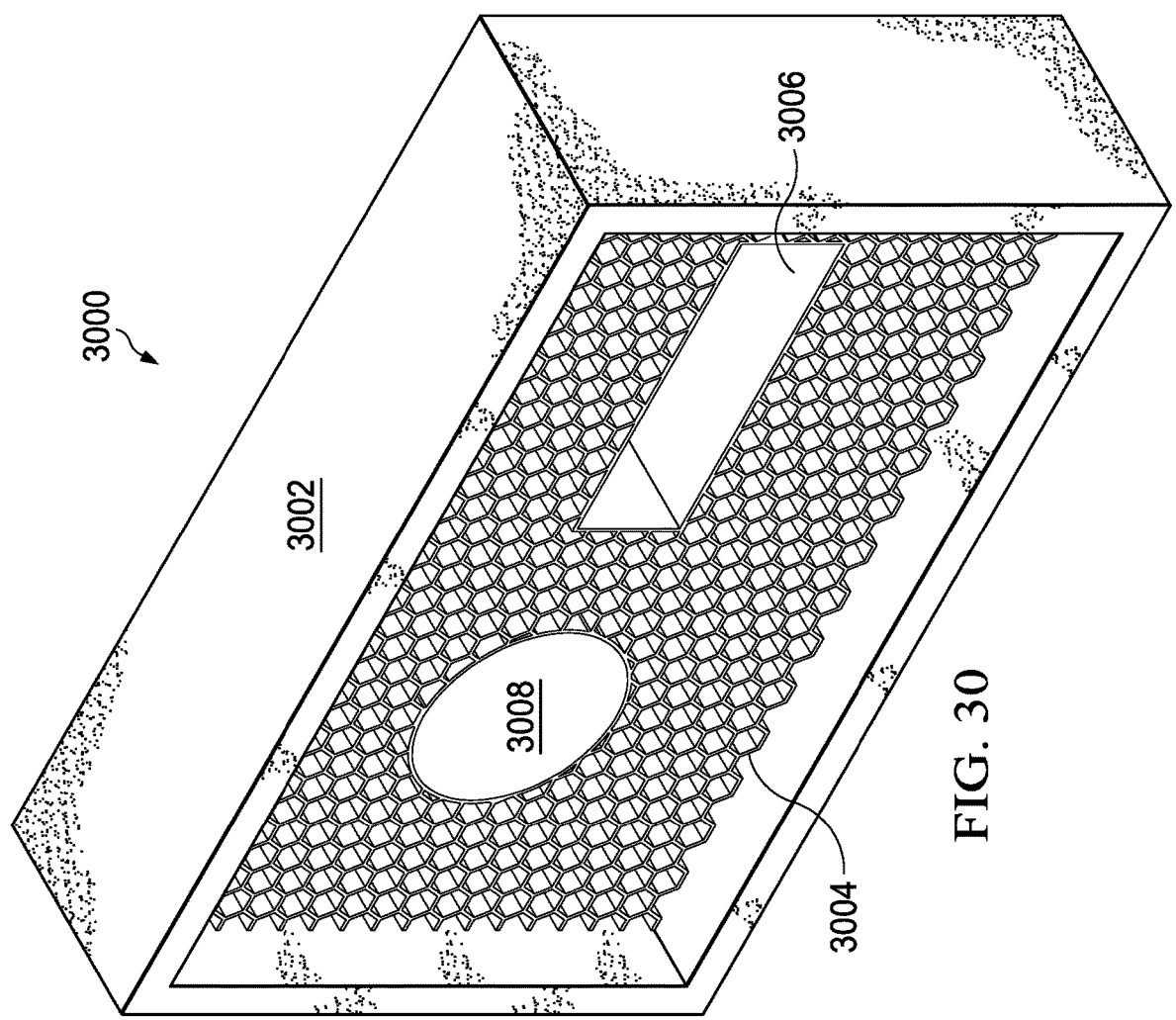
FIG. 30 is a diagram of an isometric diagram of a rectangular gasket with an I-beam structure, reinforced honeycomb support, a rectangular penetration and a circular penetration, in accordance with an example embodiment of the present disclosure.

FIG. 30 is a diagram of an isometric diagram of a rectangular gasket 3000 with an I-beam structure, reinforced honeycomb support, a rectangular penetration and a circular penetration, in accordance with an example embodiment of the present disclosure. Gasket 3000 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 3000 includes I beam body 3002, honeycomb fill 3004, rectangular penetration 3006 and circular penetration 3008, as well as surfaces similar to those of gasket 100. In addition, suitable modifications can be made to gasket 30000 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 3000 can be secured in position with glue, cement, rivets, bolts, clasps or other suitable devices (not explicitly shown).

Figure 31:
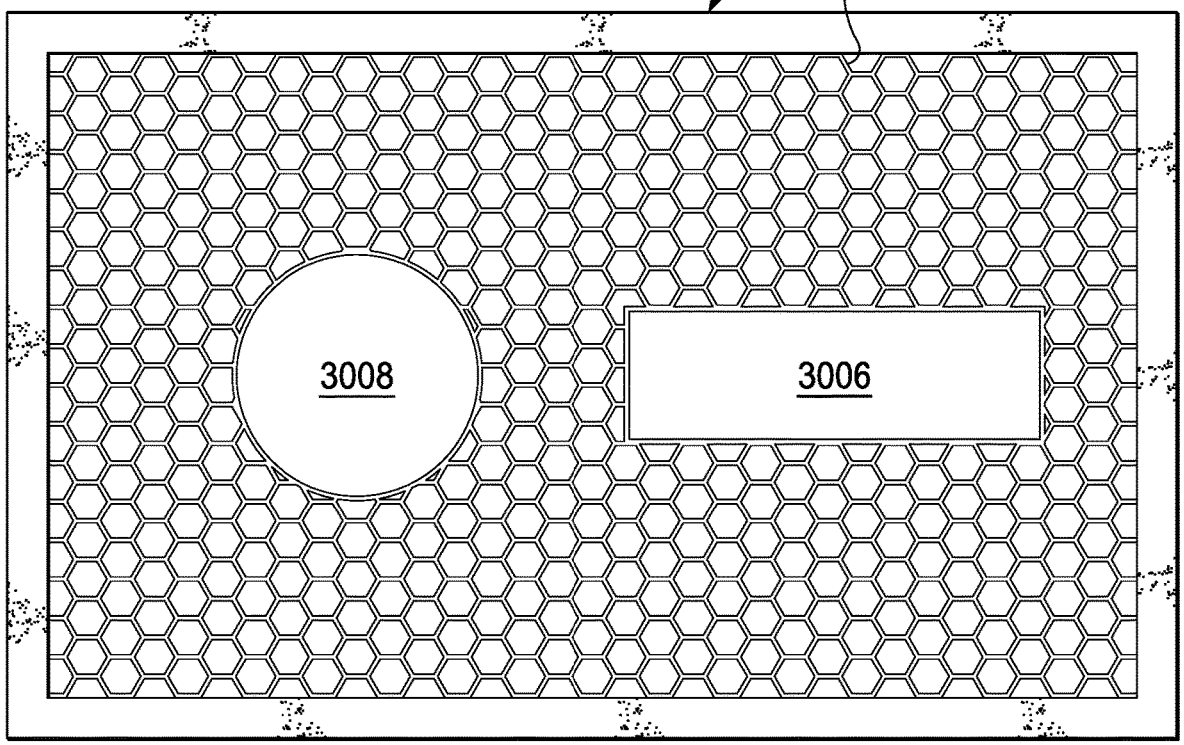
FIG. 31 is a diagram of a front view of a rectangular gasket with an I-beam structure, reinforced honeycomb support, a rectangular penetration and a circular penetration, in accordance with an example embodiment of the present disclosure.

FIG. 31 is a diagram of a front view of rectangular gasket 3000 with an I-beam structure, reinforced honeycomb support, a rectangular penetration and a circular penetration, in accordance with an example embodiment of the present disclosure.

Figure 32:
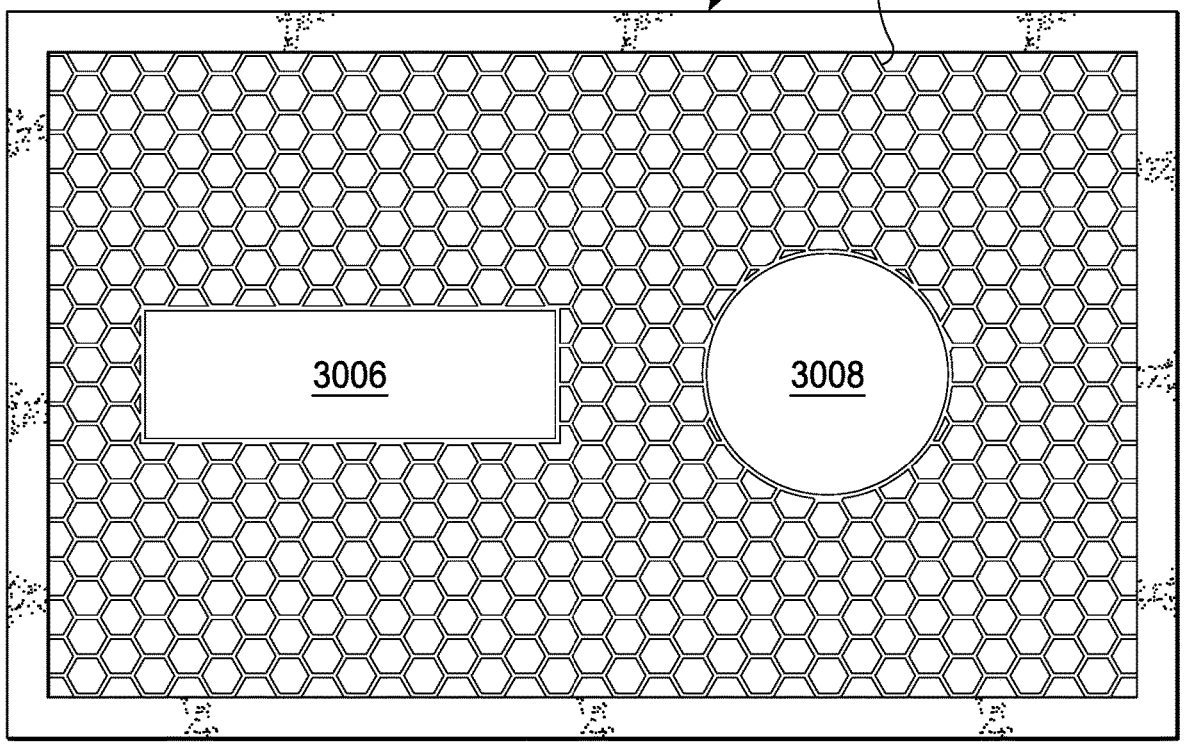
FIG. 32 is a diagram of a rear view of a rectangular gasket with an I-beam structure, reinforced honeycomb support, a rectangular penetration and a circular penetration, in accordance with an example embodiment of the present disclosure.

FIG. 32 is a diagram of a rear view of rectangular gasket 3000 with an I-beam structure, reinforced honeycomb support, a rectangular penetration and a circular penetration, in accordance with an example embodiment of the present disclosure.

Figure 33:
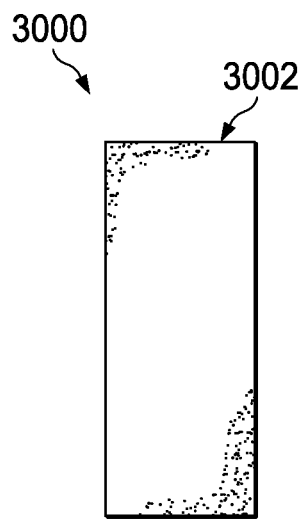
FIG. 33 is a diagram of a right view of a rectangular gasket with an I-beam structure, reinforced honeycomb support, a rectangular penetration and a circular penetration, in accordance with an example embodiment of the present disclosure.

FIG. 33 is a diagram of a right view of rectangular gasket 3000 with an I-beam structure, reinforced honeycomb support, a rectangular penetration and a circular penetration, in accordance with an example embodiment of the present disclosure.

Figure 34:
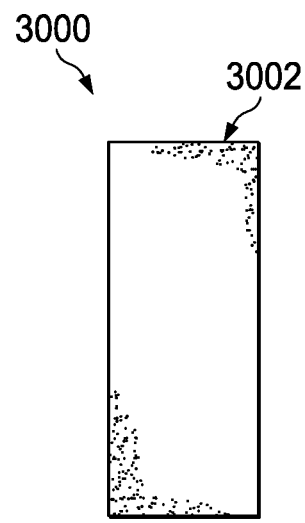
FIG. 34 is a diagram of a left view of a rectangular gasket with an I-beam structure, reinforced honeycomb support, a rectangular penetration and a circular penetration, in accordance with an example embodiment of the present disclosure.

FIG. 34 is a diagram of a left view of rectangular gasket 3000 with an I-beam structure, reinforced honeycomb support, a rectangular penetration and a circular penetration, in accordance with an example embodiment of the present disclosure.

Figure 35:
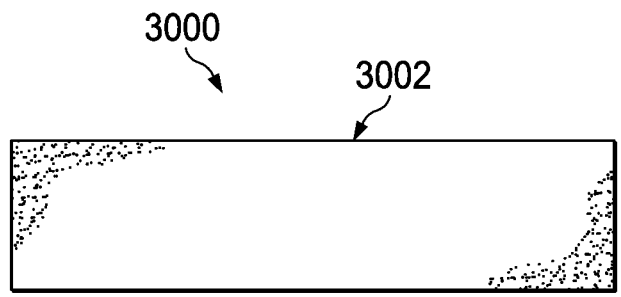
FIG. 35 is a diagram of a top view of a rectangular gasket with an I-beam structure, reinforced honeycomb support, a rectangular penetration and a circular penetration, in accordance with an example embodiment of the present disclosure.

FIG. 35 is a diagram of a top view of rectangular gasket 3000 with an I-beam structure, reinforced honeycomb support, a rectangular penetration and a circular penetration, in accordance with an example embodiment of the present disclosure.

Figure 36:
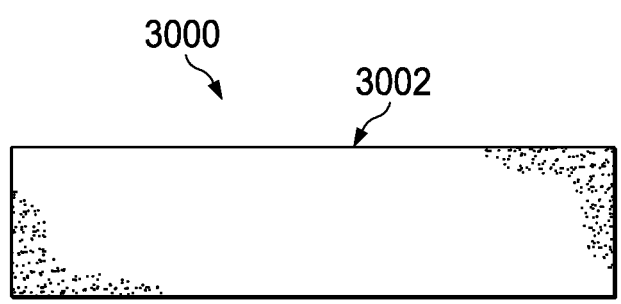
FIG. 36 is a diagram of a bottom view of a rectangular gasket with an I-beam structure, reinforced honeycomb support, a rectangular penetration and a circular penetration, in accordance with an example embodiment of the present disclosure.

FIG. 36 is a diagram of a bottom view of rectangular gasket 3000 with an I-beam structure, reinforced honeycomb support, a rectangular penetration and a circular penetration, in accordance with an example embodiment of the present disclosure.

Figure 37:
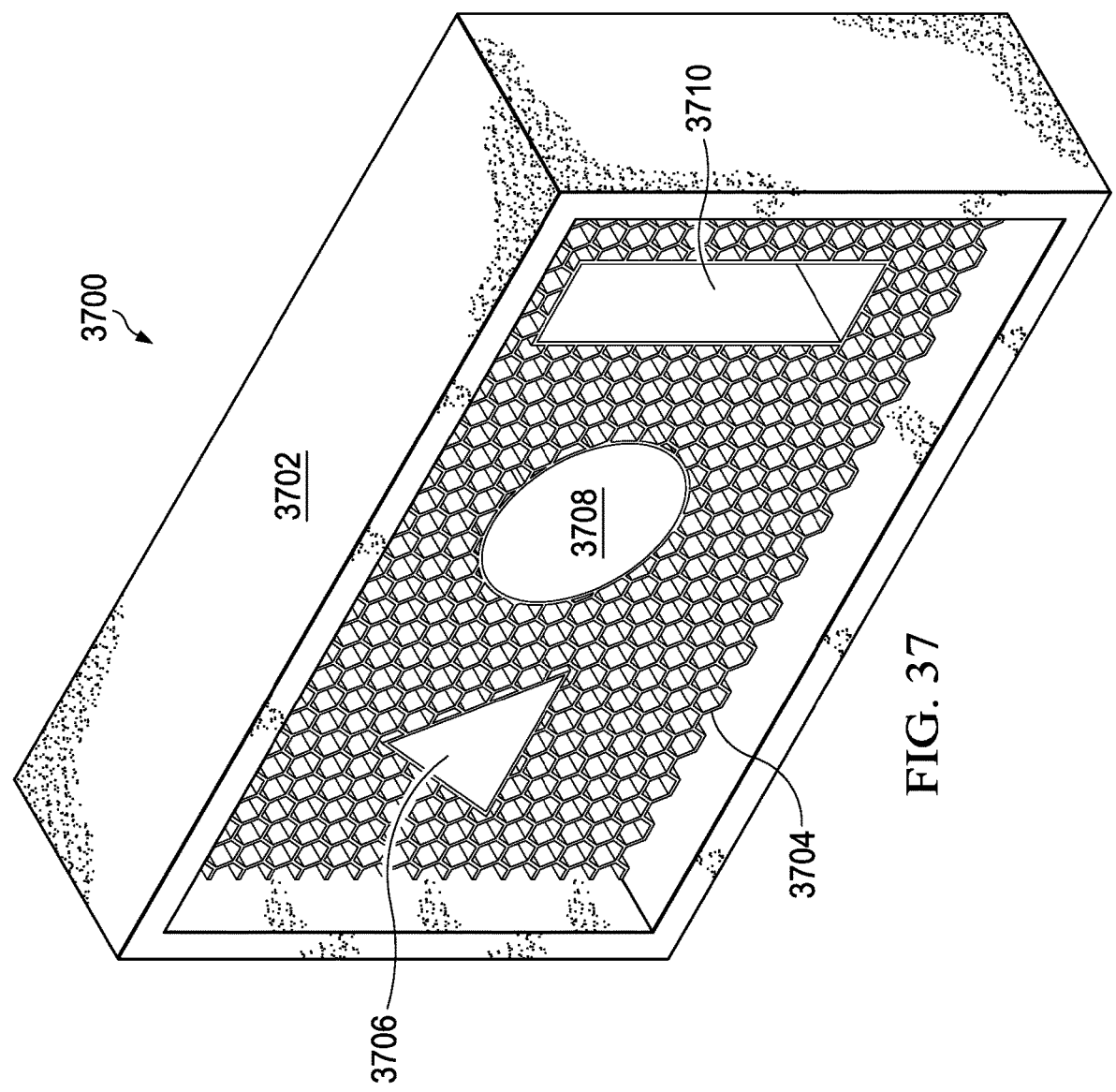
FIG. 37 is a diagram of an isometric diagram of a rectangular gasket with an I-beam structure, reinforced honeycomb support, a rectangular penetration, a circular penetration and a triangular penetration in accordance with an example embodiment of the present disclosure.

FIG. 37 is a diagram of an isometric diagram of a rectangular gasket 3700 with an I-beam structure, reinforced honeycomb support, a rectangular penetration, a circular penetration and a triangular penetration in accordance with an example embodiment of the present disclosure. Gasket 3700 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 3700 includes I beam body 3702, honeycomb fill 3704, triangle penetration 3706, circular penetration 3708, rectangular penetration 3710, as well as surfaces similar to those of gasket 100. In addition, suitable modifications can be made to gasket 3700 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 3700 can be secured in position with glue, cement, rivets, bolts, clasps or other suitable devices (not explicitly shown).

Figure 38:
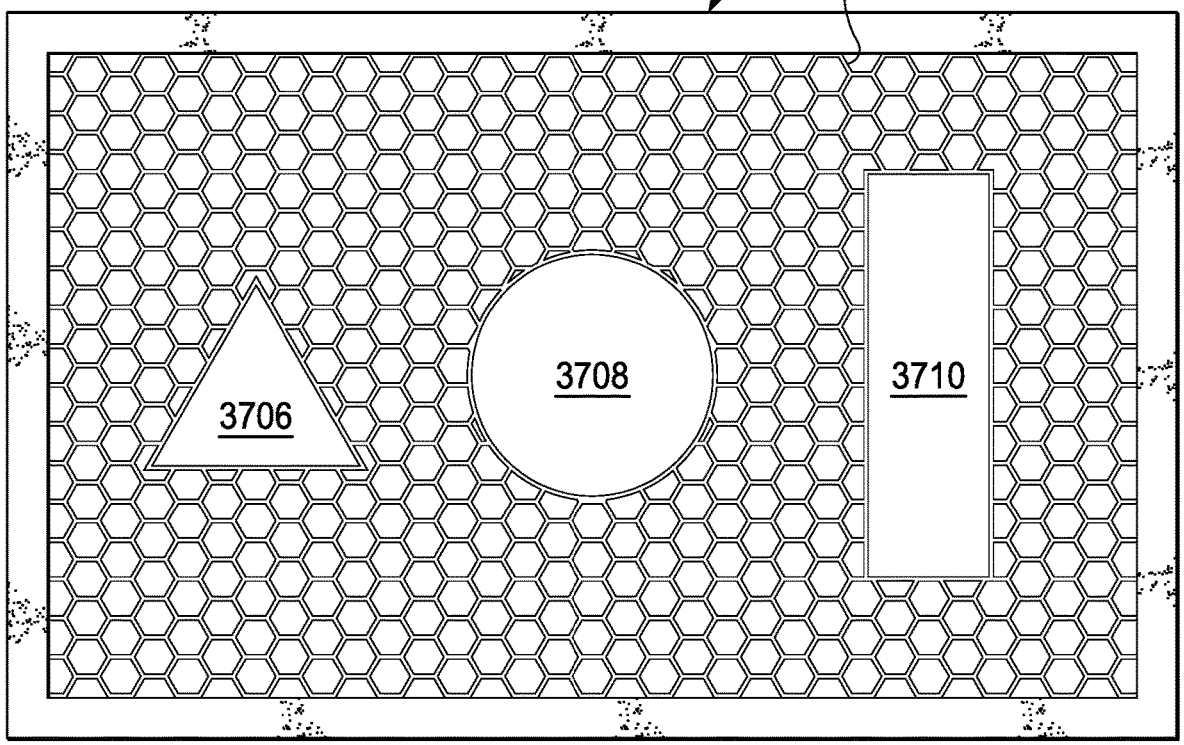
FIG. 38 is a diagram of a front view of a rectangular gasket with an I-beam structure, reinforced honeycomb support, a rectangular penetration, a circular penetration and a triangular penetration in accordance with an example embodiment of the present disclosure.

FIG. 38 is a diagram of a front view of rectangular gasket 3700 with an I-beam structure, reinforced honeycomb support, a rectangular penetration, a circular penetration and a triangular penetration in accordance with an example embodiment of the present disclosure.

Figure 39:
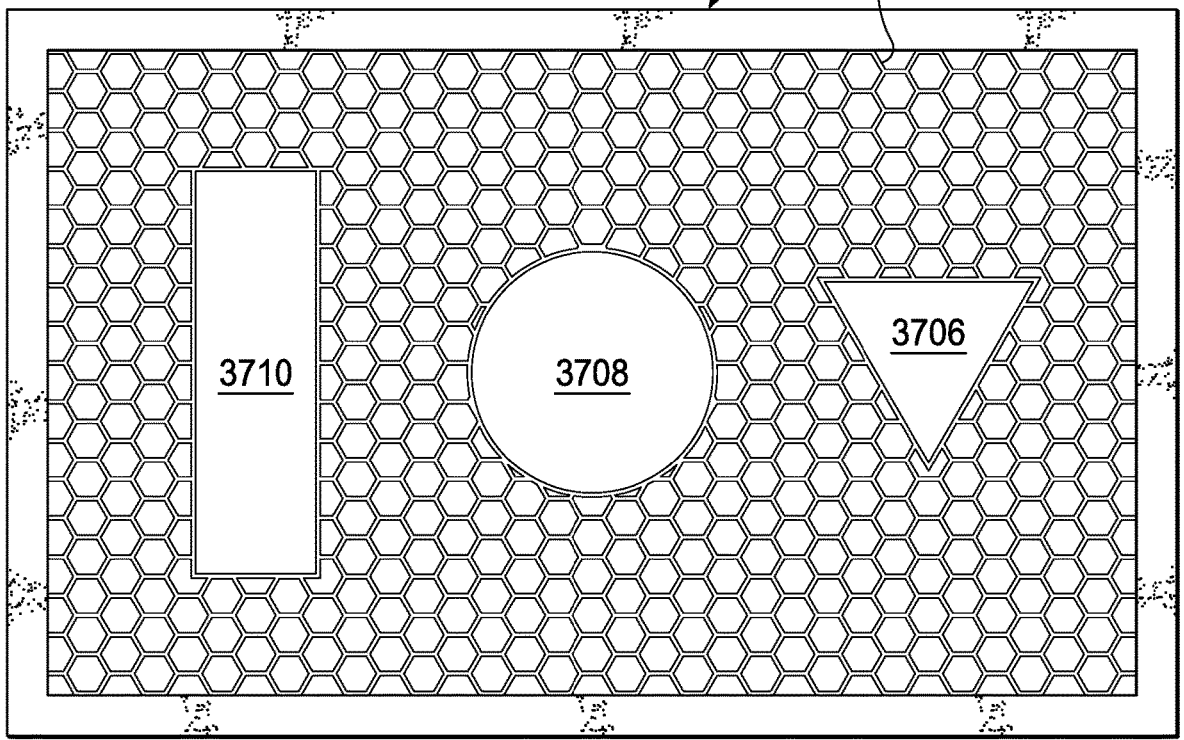
FIG. 39 is a diagram of a rear view of a rectangular gasket with an I-beam structure, reinforced honeycomb support, a rectangular penetration, a circular penetration and a triangular penetration in accordance with an example embodiment of the present disclosure.

FIG. 39 is a diagram of a rear view of rectangular gasket 3700 with an I-beam structure, reinforced honeycomb support, a rectangular penetration, a circular penetration and a triangular penetration in accordance with an example embodiment of the present disclosure.

Figure 40:
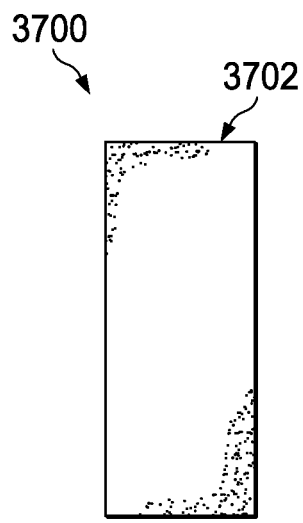
FIG. 40 is a diagram of a right view of a rectangular gasket with an I-beam structure, reinforced honeycomb support, a rectangular penetration, a circular penetration and a triangular penetration in accordance with an example embodiment of the present disclosure.

FIG. 40 is a diagram of a right view of rectangular gasket 3700 with an I-beam structure, reinforced honeycomb support, a rectangular penetration, a circular penetration and a triangular penetration in accordance with an example embodiment of the present disclosure.

Figure 41:
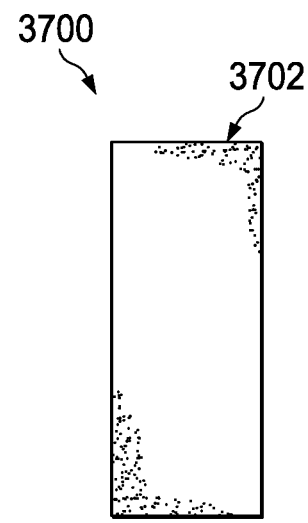
FIG. 41 is a diagram of a left view of a rectangular gasket with an I-beam structure, reinforced honeycomb support, a rectangular penetration, a circular penetration and a triangular penetration in accordance with an example embodiment of the present disclosure.

FIG. 41 is a diagram of a left view of rectangular gasket 3700 with an I-beam structure, reinforced honeycomb support, a rectangular penetration, a circular penetration and a triangular penetration in accordance with an example embodiment of the present disclosure.

Figure 42:
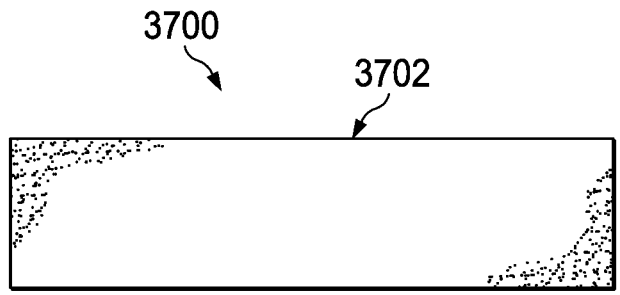
FIG. 42 is a diagram of a top view of a rectangular gasket with an I-beam structure, reinforced honeycomb support, a rectangular penetration, a circular penetration and a triangular penetration in accordance with an example embodiment of the present disclosure.

FIG. 42 is a diagram of a top view of rectangular gasket 3700 with an I-beam structure, reinforced honeycomb support, a rectangular penetration, a circular penetration and a triangular penetration in accordance with an example embodiment of the present disclosure.

Figure 43:
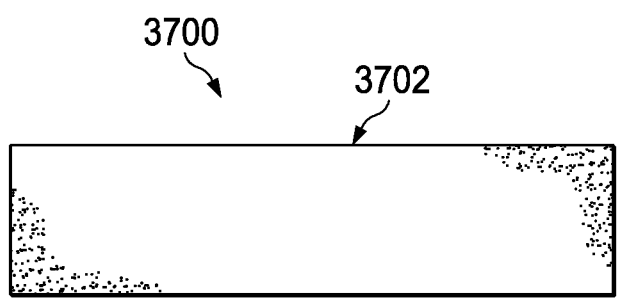
FIG. 43 is a diagram of a bottom view of a rectangular gasket with an I-beam structure, reinforced honeycomb support, a rectangular penetration, a circular penetration and a triangular penetration in accordance with an example embodiment of the present disclosure.

FIG. 43 is a diagram of a bottom view of rectangular gasket 3700 with an I-beam structure, reinforced honeycomb support, a rectangular penetration, a circular penetration and a triangular penetration in accordance with an example embodiment of the present disclosure.

Figure 44:
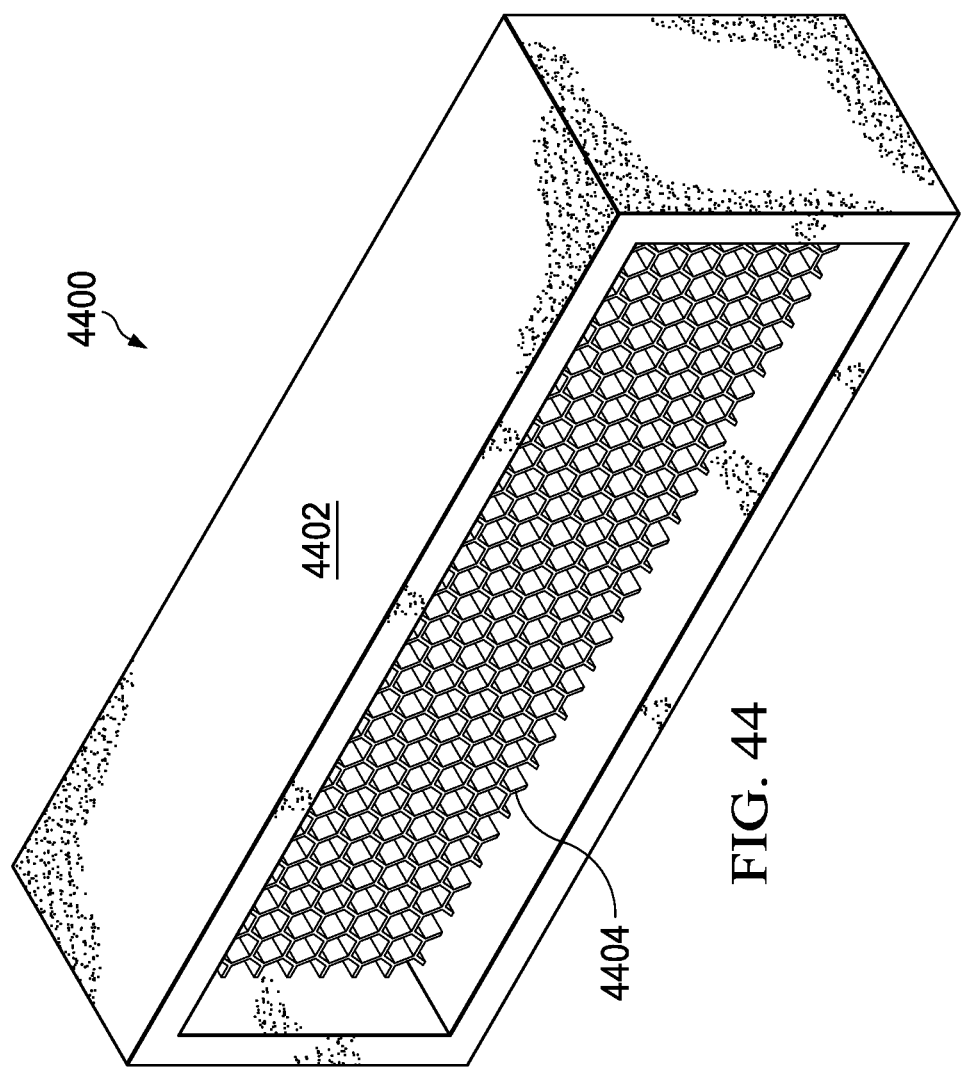
FIG. 44 is a diagram of an isometric diagram of a rectangular gasket with an I-beam structure, in accordance with an example embodiment of the present disclosure.

FIG. 44 is a diagram of an isometric diagram of a rectangular gasket 4400 with an I-beam structure, in accordance with an example embodiment of the present disclosure. Gasket 4400 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 4400 includes I beam body 4402 and honeycomb fill 4404, as well as surfaces similar to those of gasket 100. In addition, suitable modifications can be made to gasket 4400 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 4400 can be secured in position with glue, cement, rivets, bolts, clasps or other suitable devices (not explicitly shown).

Figure 45:
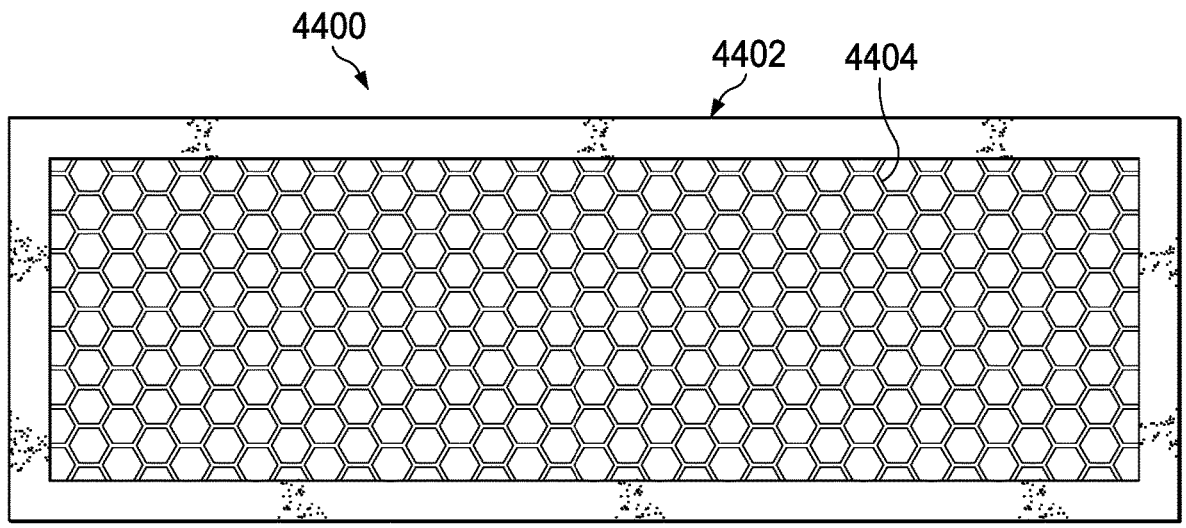
FIG. 45 is a diagram of a front view of a rectangular gasket with an I-beam structure, in accordance with an example embodiment of the present disclosure.

FIG. 45 is a diagram of a front view of rectangular gasket 4400 with an I-beam structure, in accordance with an example embodiment of the present disclosure.

Figure 46:
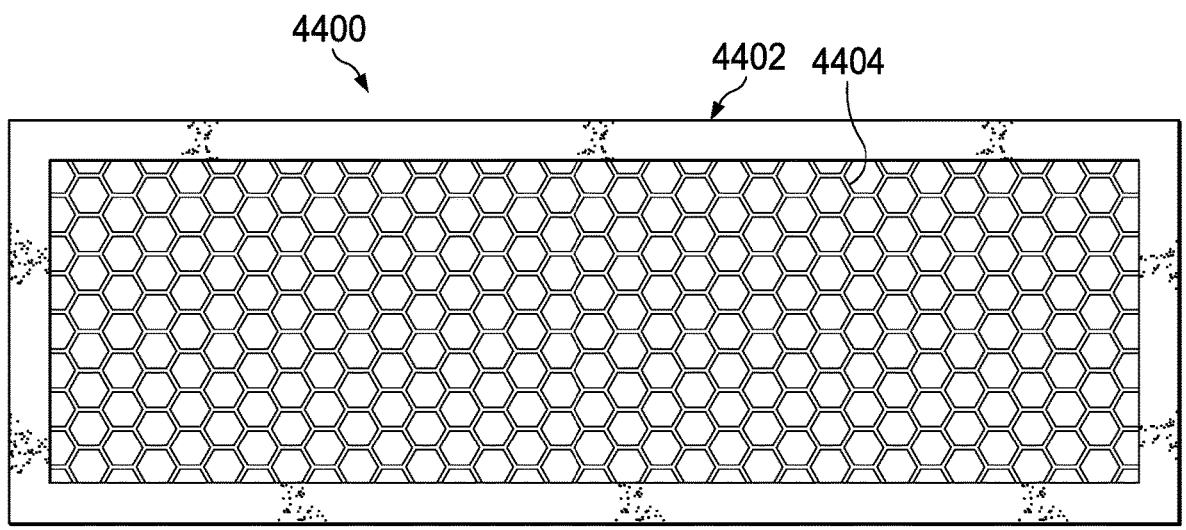
FIG. 46 is a diagram of a rear view of a rectangular gasket with an I-beam structure, in accordance with an example embodiment of the present disclosure.

FIG. 46 is a diagram of a rear view of rectangular gasket 4400 with an I-beam structure, in accordance with an example embodiment of the present disclosure.

Figure 47:
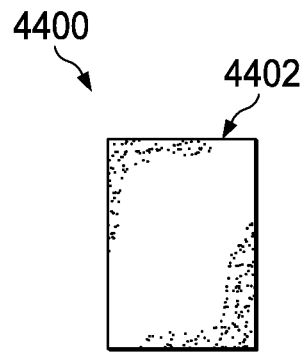
FIG. 47 is a diagram of a right view of a rectangular gasket with an I-beam structure, in accordance with an example embodiment of the present disclosure.

FIG. 47 is a diagram of a right view of rectangular gasket 4400 with an I-beam structure, in accordance with an example embodiment of the present disclosure.

Figure 48:
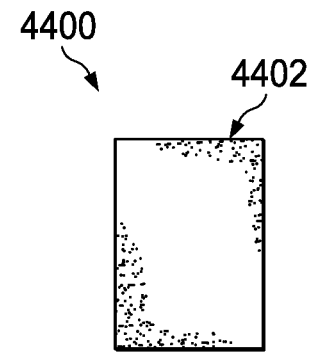
FIG. 48 is a diagram of a left view of a rectangular gasket with an I-beam structure, in accordance with an example embodiment of the present disclosure.

FIG. 48 is a diagram of a left view of rectangular gasket 4400 with an I-beam structure, in accordance with an example embodiment of the present disclosure.

Figure 49:
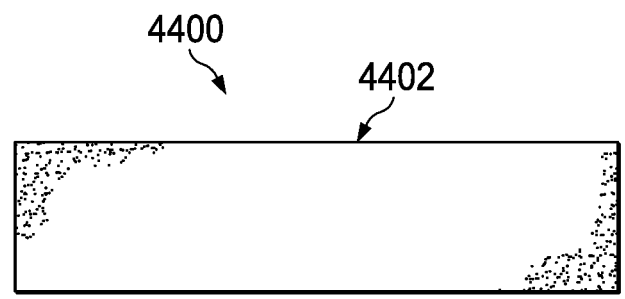
FIG. 49 is a diagram of a top view of a rectangular gasket with an I-beam structure, in accordance with an example embodiment of the present disclosure.

FIG. 49 is a diagram of a top view of rectangular gasket 4400 with an I-beam structure, in accordance with an example embodiment of the present disclosure.

Figure 50:
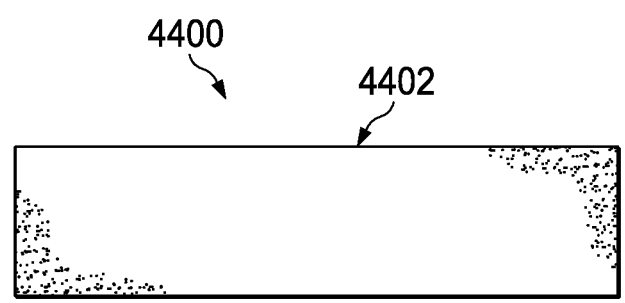
FIG. 50 is a diagram of a bottom view of a rectangular gasket with an I-beam structure, in accordance with an example embodiment of the present disclosure.

FIG. 50 is a diagram of a bottom view of rectangular gasket 4400 with an I-beam structure, in accordance with an example embodiment of the present disclosure.

Figure 51:
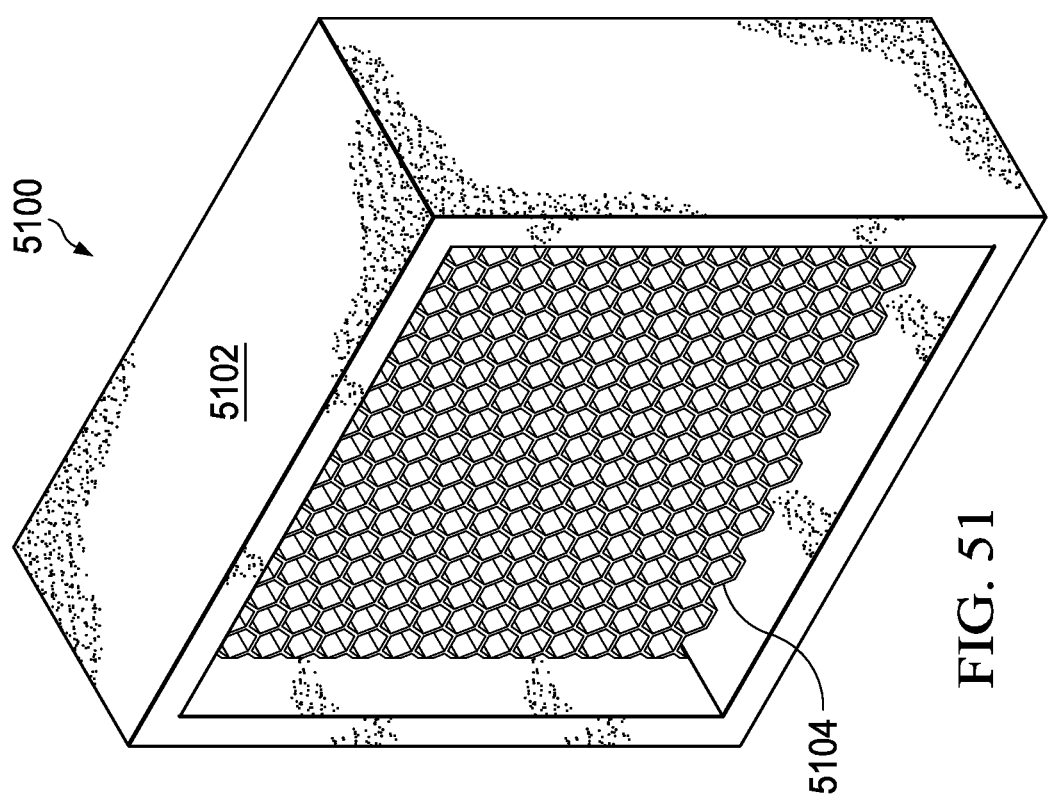
FIG. 51 is a diagram of an isometric view of a square gasket with an I-beam structure, in accordance with an example embodiment of the present disclosure.

FIG. 51 is a diagram of an isometric view of a square gasket 5100 with an I-beam structure, in accordance with an example embodiment of the present disclosure. Gasket 5100 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 5100 includes I beam body 5102 and honeycomb fill 5104, as well as surfaces similar to those of gasket 100. In addition, suitable modifications can be made to gasket 5100 as with gasket 100, such as to have all rounded corners, all square corners, different corner shapes, a combination of corner shapes, thicker or thinner edges, thicker or thinner fill, a penetration or penetrations of other shapes, or other suitable modifications. Gasket 5100 can be secured in position with glue, cement, rivets, bolts, clasps or other suitable devices (not explicitly shown).

Figure 52:
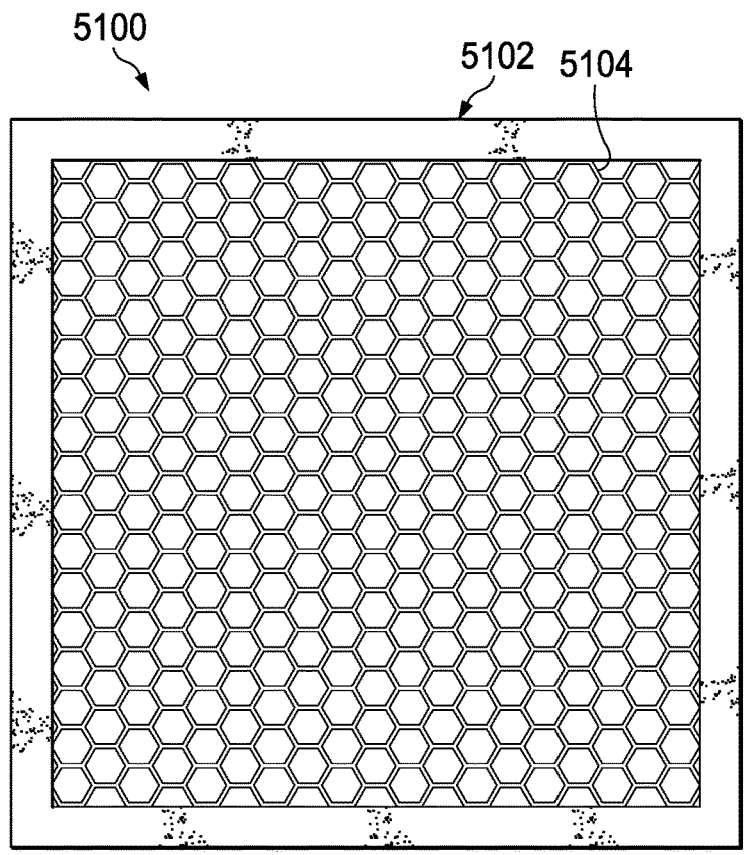
FIG. 52 is a diagram of a front view of a square gasket with an I-beam structure, in accordance with an example embodiment of the present disclosure.

FIG. 52 is a diagram of a front view of square gasket 5200 with an I-beam structure, in accordance with an example embodiment of the present disclosure.

Figure 53:
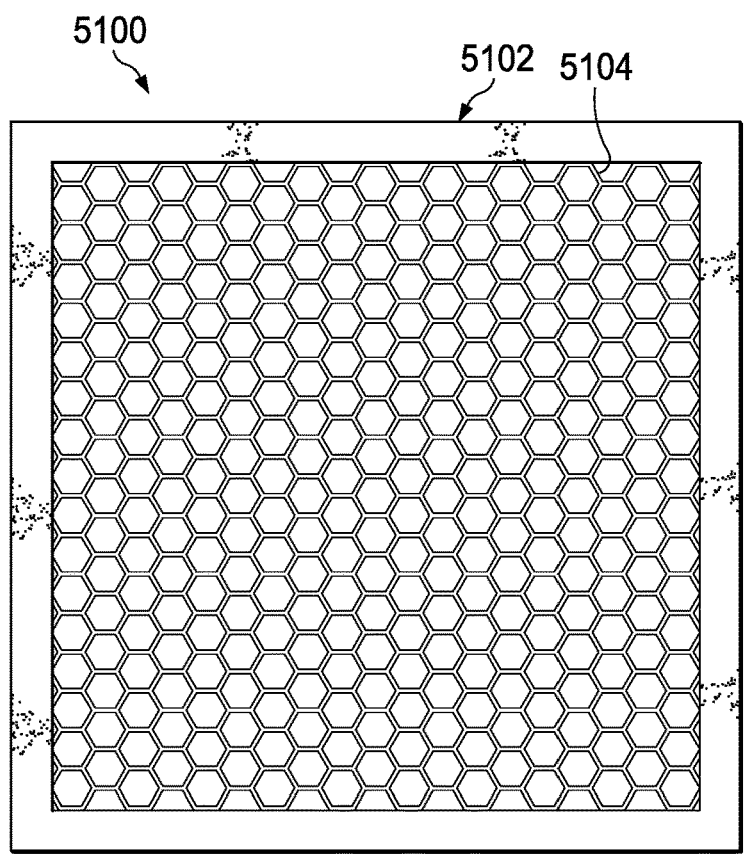
FIG. 53 is a diagram of a rear view of a square gasket with an I-beam structure, in accordance with an example embodiment of the present disclosure.

FIG. 53 is a diagram of a rear view of square gasket 5200 with an I-beam structure, in accordance with an example embodiment of the present disclosure.

FIG. 54 is a diagram of a right view of square gasket 5200 with an I-beam structure, in accordance with an example embodiment of the present disclosure.

FIG. 55 is a diagram of a left view of square gasket 5200 with an I-beam structure, in accordance with an example embodiment of the present disclosure.

FIG. 56 is a diagram of a top view of square gasket 5200 with an I-beam structure, in accordance with an example embodiment of the present disclosure.

FIG. 57 is a diagram of a bottom view of square gasket 5200 with an I-beam structure, in accordance with an example embodiment of the present disclosure.

Figure 58:
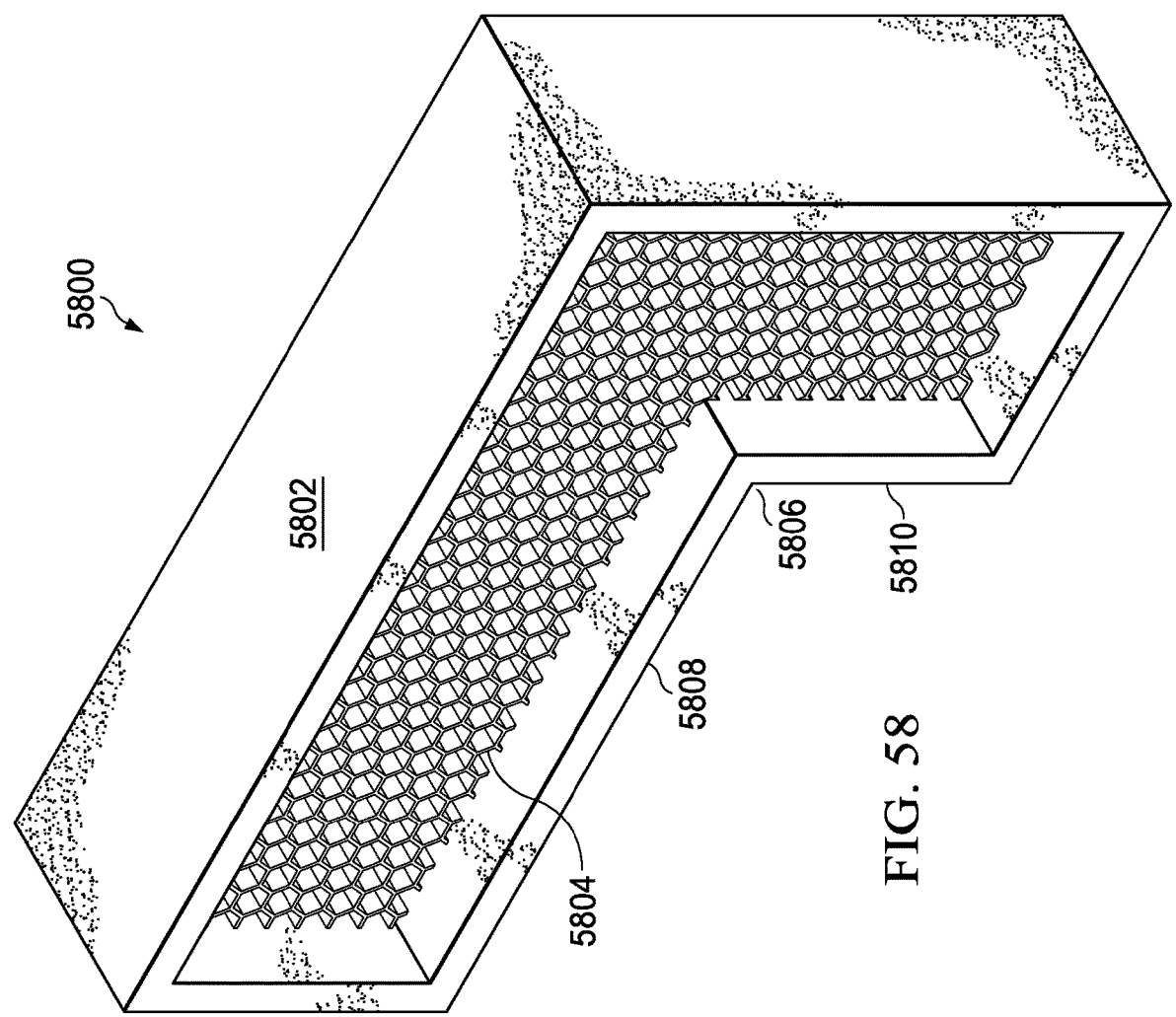
FIG. 58 is a diagram of an isometric view of an L-shaped gasket with an I-beam structure, in accordance with an example embodiment of the present disclosure.

FIG. 58 is a diagram of an isometric view of an L-shaped gasket 5800 with an I-beam structure, in accordance with an example embodiment of the present disclosure. Gasket 5800 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 5800 includes I beam body 5802, honeycomb fill 5804, interior corner 5806, lower interior leg surface 5808 and side interior leg surface 5810, as well as surfaces similar to those of gasket 100. In addition, suitable modifications can be made to gasket 5800 as with gasket 100, such as to have all rounded corners, all square corners, different corner shapes, a combination of corner shapes, thicker or thinner edges, thicker or thinner fill, longer or shorter legs, one or more additional legs, curved or irregular shaped legs, a penetration or penetrations of other shapes, or other suitable modifications. Gasket 5800 can be secured in position with glue, cement, rivets, bolts, clasps or other suitable devices (not explicitly shown).

Figure 59:
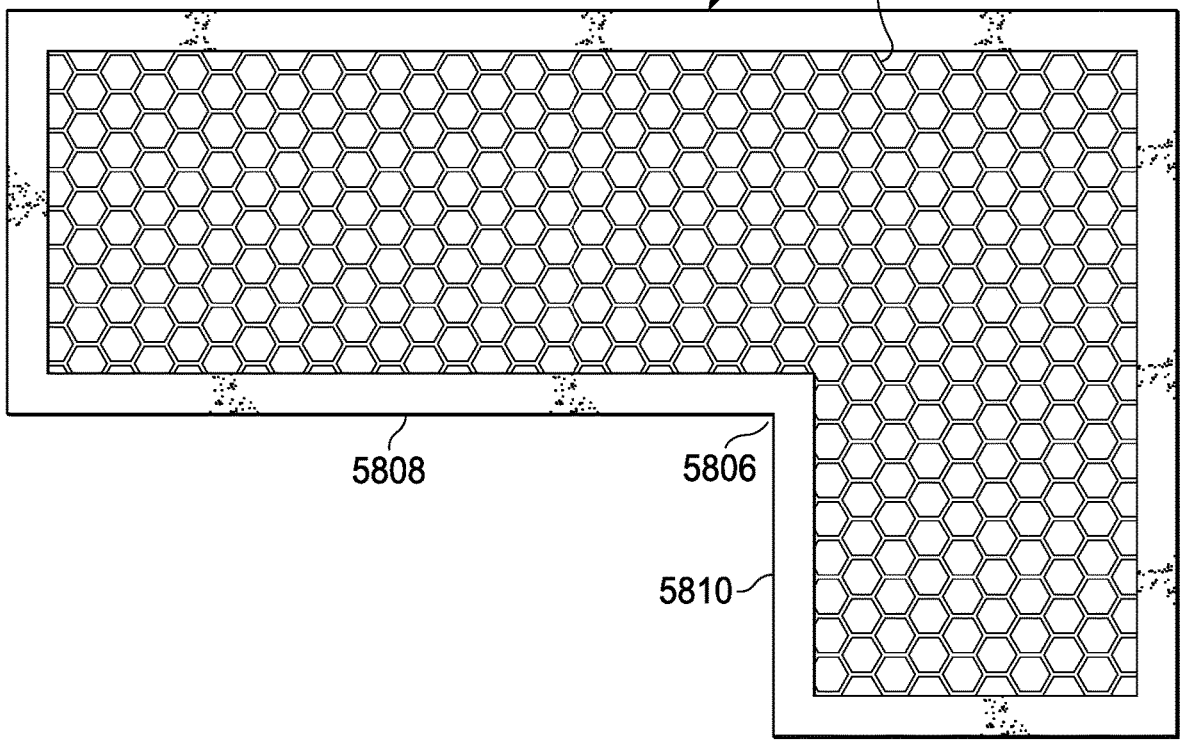
FIG. 59 is a diagram of a front view of an L-shaped gasket with an I-beam structure, in accordance with an example embodiment of the present disclosure.

FIG. 59 is a diagram of a front view of L-shaped gasket 5800 with an I-beam structure, in accordance with an example embodiment of the present disclosure.

Figure 60:
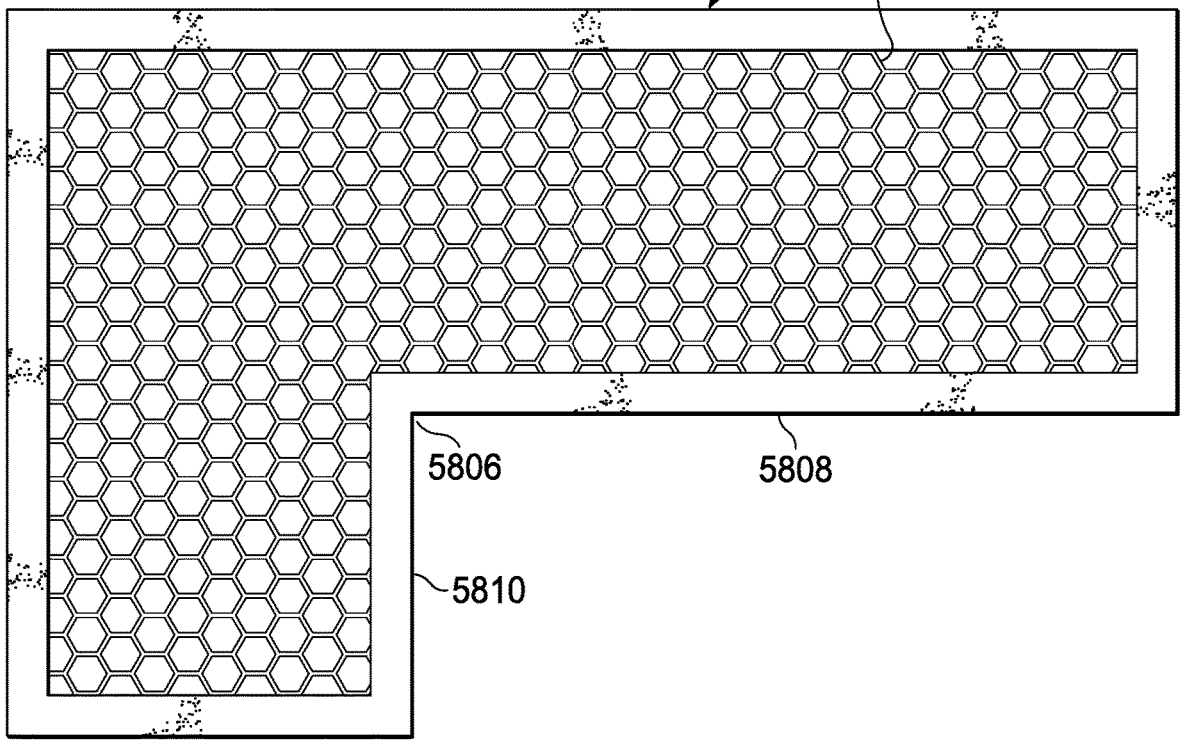
FIG. 60 is a diagram of a rear view of an L-shaped gasket with an I-beam structure, in accordance with an example embodiment of the present disclosure.

FIG. 60 is a diagram of a rear view of L-shaped gasket 5800 with an I-beam structure, in accordance with an example embodiment of the present disclosure.

Figure 61:
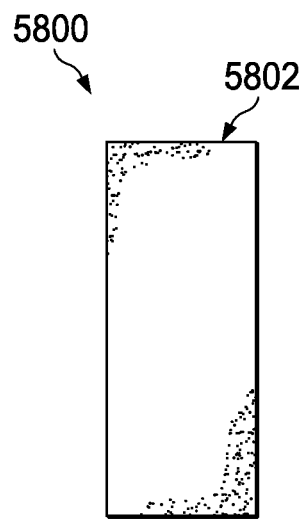
FIG. 61 is a diagram of a right view of an L-shaped gasket with an I-beam structure, in accordance with an example embodiment of the present disclosure.

FIG. 61 is a diagram of a right view of L-shaped gasket 5800 with an I-beam structure, in accordance with an example embodiment of the present disclosure.

Figure 62:
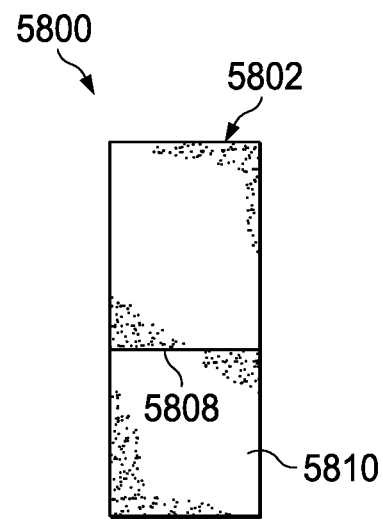
FIG. 62 is a diagram of a left view of an L-shaped gasket with an I-beam structure, in accordance with an example embodiment of the present disclosure.

FIG. 62 is a diagram of a left view of L-shaped gasket 5800 with an I-beam structure, in accordance with an example embodiment of the present disclosure.

Figure 63:
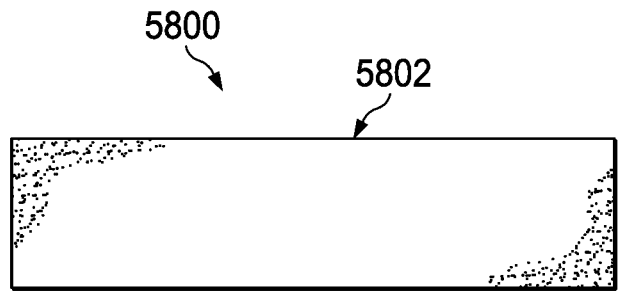
FIG. 63 is a diagram of a top view of an L-shaped gasket with an I-beam structure, in accordance with an example embodiment of the present disclosure.

FIG. 63 is a diagram of a top view of L-shaped gasket 5800 with an I-beam structure, in accordance with an example embodiment of the present disclosure.

Figure 64:
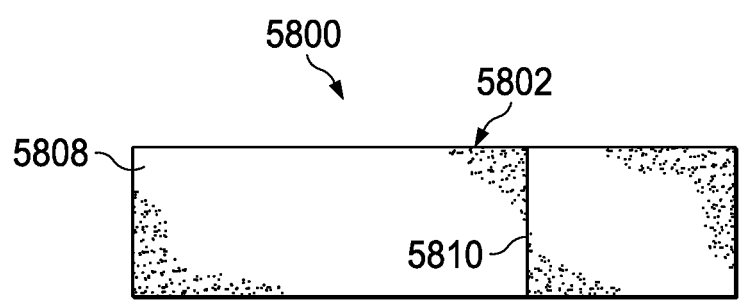
FIG. 64 is a diagram of a bottom view of an L-shaped gasket with an I-beam structure, in accordance with an example embodiment of the present disclosure.

FIG. 64 is a diagram of a bottom view of L-shaped gasket 5800 with an I-beam structure, in accordance with an example embodiment of the present disclosure.

Figure 65:
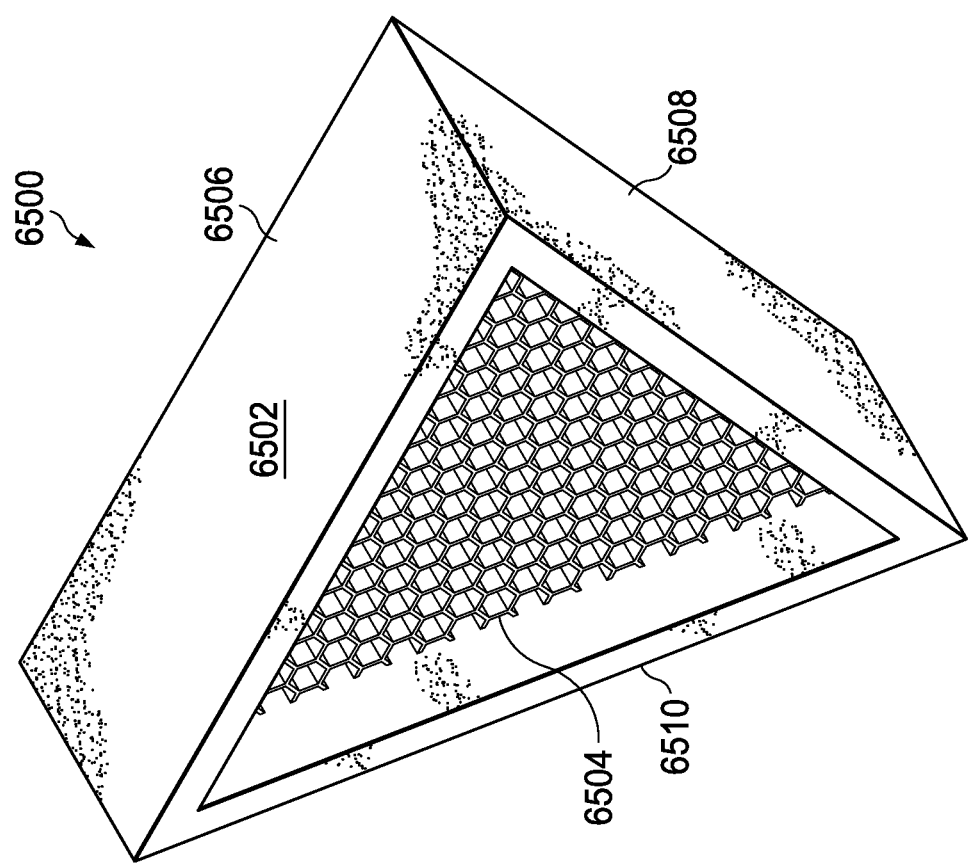
FIG. 65 is a diagram of an isometric view of a triangular gasket with an I-beam structure, in accordance with an example embodiment of the present disclosure.

FIG. 65 is a diagram of an isometric view of a triangular gasket 6500 with an I-beam structure, in accordance with an example embodiment of the present disclosure. While an equilateral triangle is shown, any other suitable triangular or N-angular shape can also or alternatively be used, such as isosceles triangles, pentagons, heptagons, hexagons, octagons, nonagons and so forth, as well as shapes that are combinations of partial components of such shapes. Gasket 6500 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 6500 includes I beam body 6502, honeycomb fill 6504, first side 6506, second side 6508 and third side 6510, as well as surfaces similar to those of gasket 100. In addition, suitable modifications can be made to gasket 6500 as with gasket 100, such as to have all rounded corners, all square corners, different corner shapes, a combination of corner shapes, thicker or thinner edges, thicker or thinner fill, longer or shorter sides, one or more additional sides, curved or irregular shaped sides, a penetration or penetrations of other shapes, or other suitable modifications. Gasket 6500 can be secured in position with glue, cement, rivets, bolts, clasps or other suitable devices (not explicitly shown).

Figure 66:
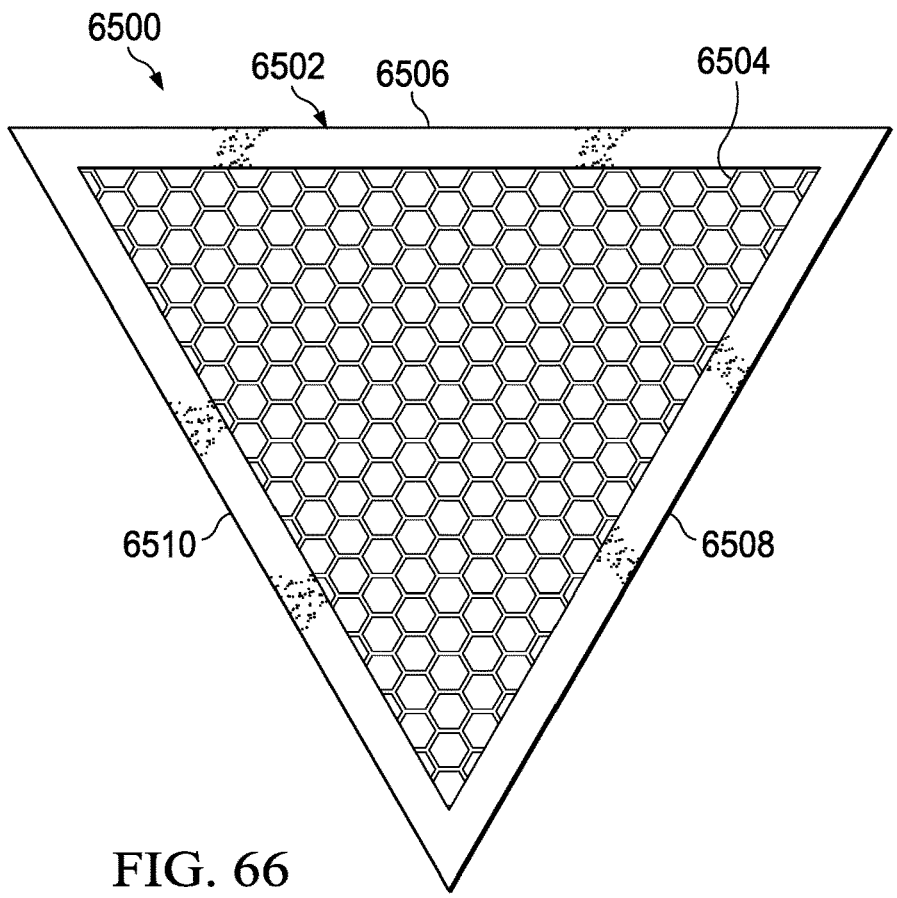
FIG. 66 is a diagram of a front view of a triangular gasket with an I-beam structure, in accordance with an example embodiment of the present disclosure.

FIG. 66 is a diagram of a front view of triangular gasket 6500 with an I-beam structure, in accordance with an example embodiment of the present disclosure.

Figure 67:
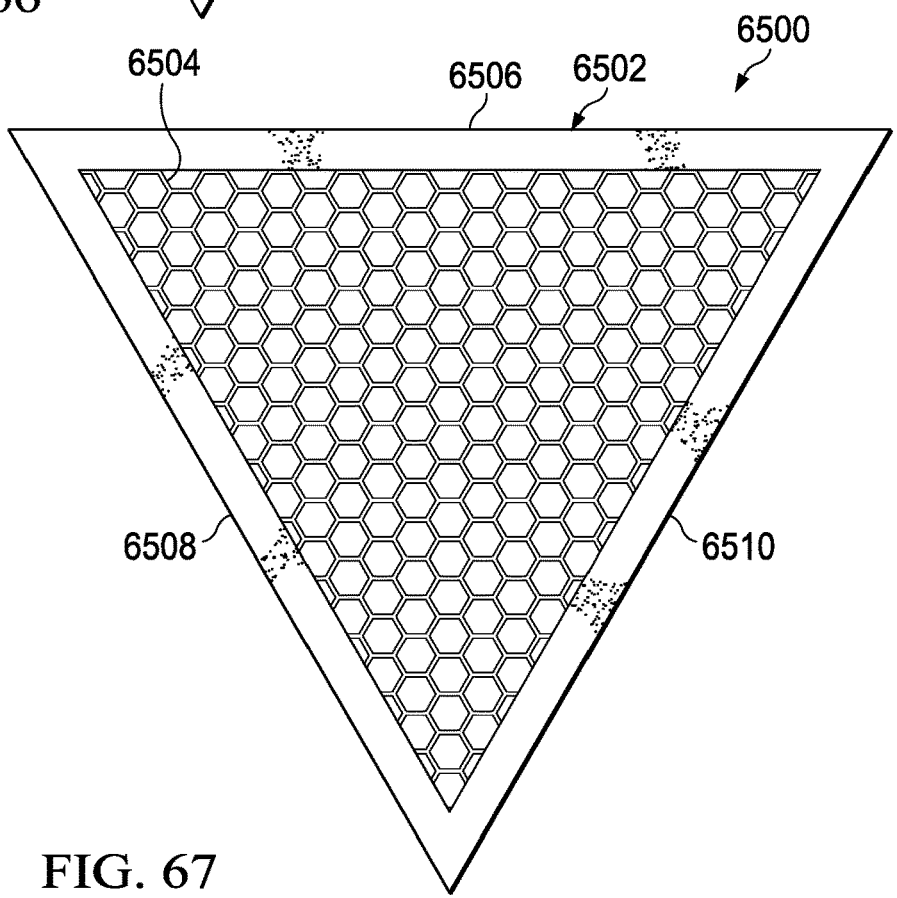
FIG. 67 is a diagram of a rear view of a triangular gasket with an I-beam structure, in accordance with an example embodiment of the present disclosure.

FIG. 67 is a diagram of a rear view of triangular gasket 6500 with an I-beam structure, in accordance with an example embodiment of the present disclosure.

Figure 68:
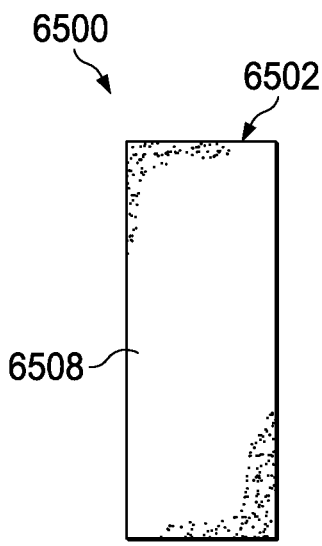
FIG. 68 is a diagram of a right view of a triangular gasket with an I-beam structure, in accordance with an example embodiment of the present disclosure.

FIG. 68 is a diagram of a right view of triangular gasket 6500 with an I-beam structure, in accordance with an example embodiment of the present disclosure.

Figure 69:
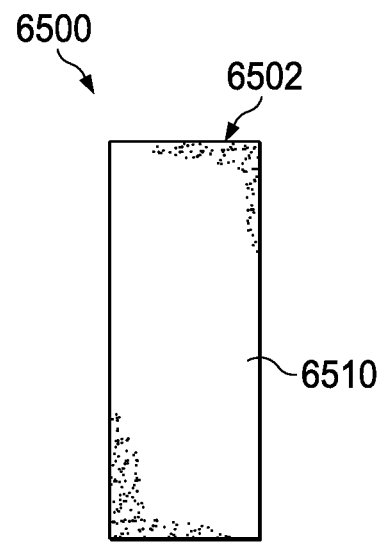
FIG. 69 is a diagram of a left view of a triangular gasket with an I-beam structure, in accordance with an example embodiment of the present disclosure.

FIG. 69 is a diagram of a left view of triangular gasket 6500 with an I-beam structure, in accordance with an example embodiment of the present disclosure.

Figure 70:
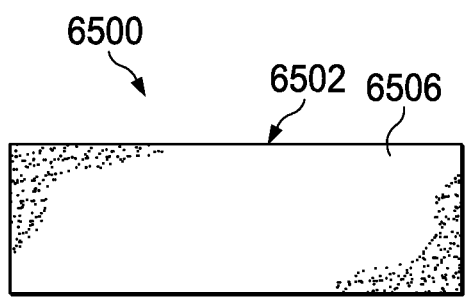
FIG. 70 is a diagram of a top view of a triangular gasket with an I-beam structure, in accordance with an example embodiment of the present disclosure.

FIG. 70 is a diagram of a top view of triangular gasket 6500 with an I-beam structure, in accordance with an example embodiment of the present disclosure.

Figure 71:
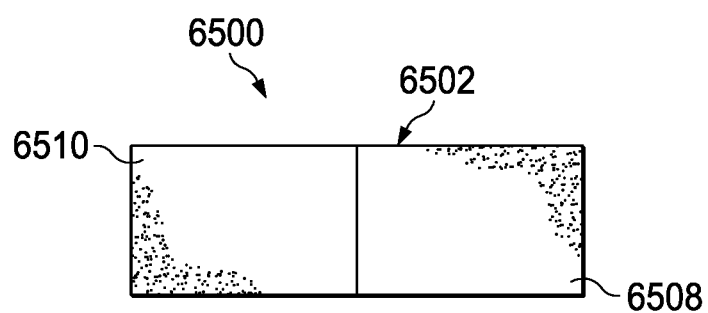
FIG. 71 is a diagram of a bottom view of a triangular gasket with an I-beam structure, in accordance with an example embodiment of the present disclosure.

FIG. 71 is a diagram of a bottom view of triangular gasket 6500 with an I-beam structure, in accordance with an example embodiment of the present disclosure.

Figure 72:
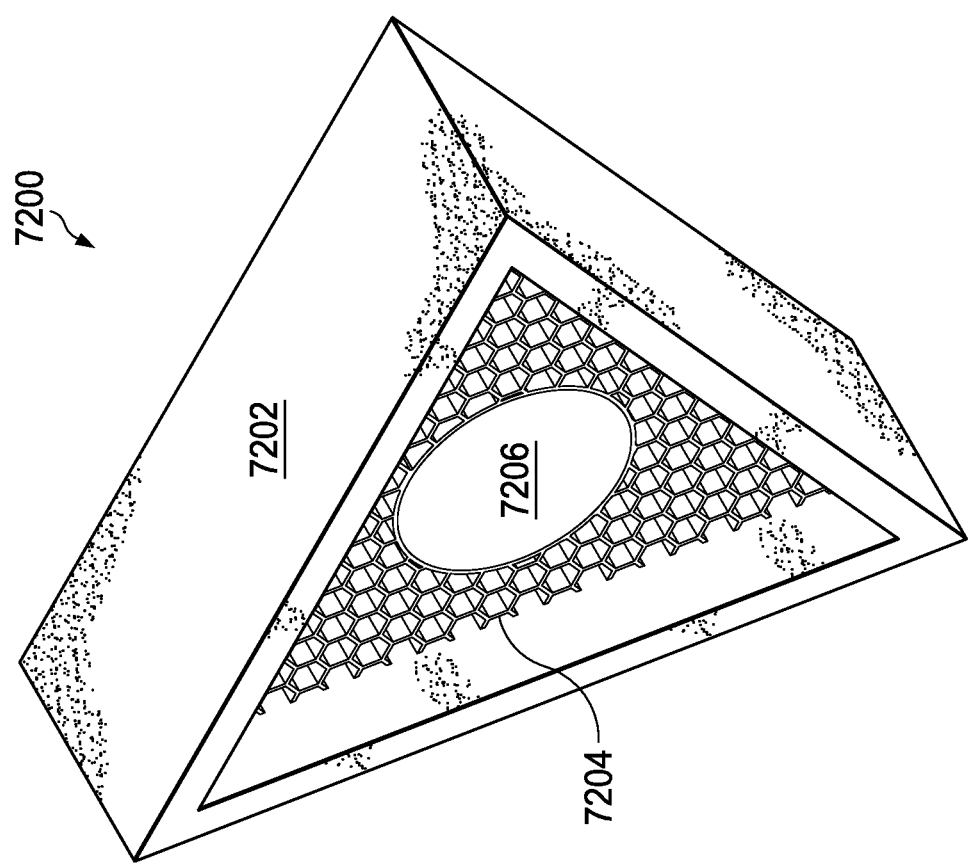
FIG. 72 is a diagram of an isometric view of a triangular gasket with an I-beam structure and a circular penetration, in accordance with an example embodiment of the present disclosure.

FIG. 72 is a diagram of an isometric view of a triangular gasket 7200 with an I-beam structure and a circular penetration, in accordance with an example embodiment of the present disclosure. While an equilateral triangle is shown, any other suitable triangular or N-angular shape can also or alternatively be used, such as isosceles triangles, pentagons, heptagons, hexagons, octagons, nonagons and so forth, as well as shapes that are combinations of partial components of such shapes. Gasket 7200 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 7200 includes I beam body 7202, honeycomb fill 7204 and penetration 7206, as well as surfaces similar to those of gasket 100. In addition, suitable modifications can be made to gasket 7200 as with gasket 100, such as to have all rounded corners, all square corners, different corner shapes, a combination of corner shapes, thicker or thinner edges, thicker or thinner fill, longer or shorter sides, one or more additional sides, curved or irregular shaped sides, a penetration or penetrations of other shapes, or other suitable modifications. Gasket 7200 can be secured in position with glue, cement, rivets, bolts, clasps or other suitable devices (not explicitly shown).

Figure 73:
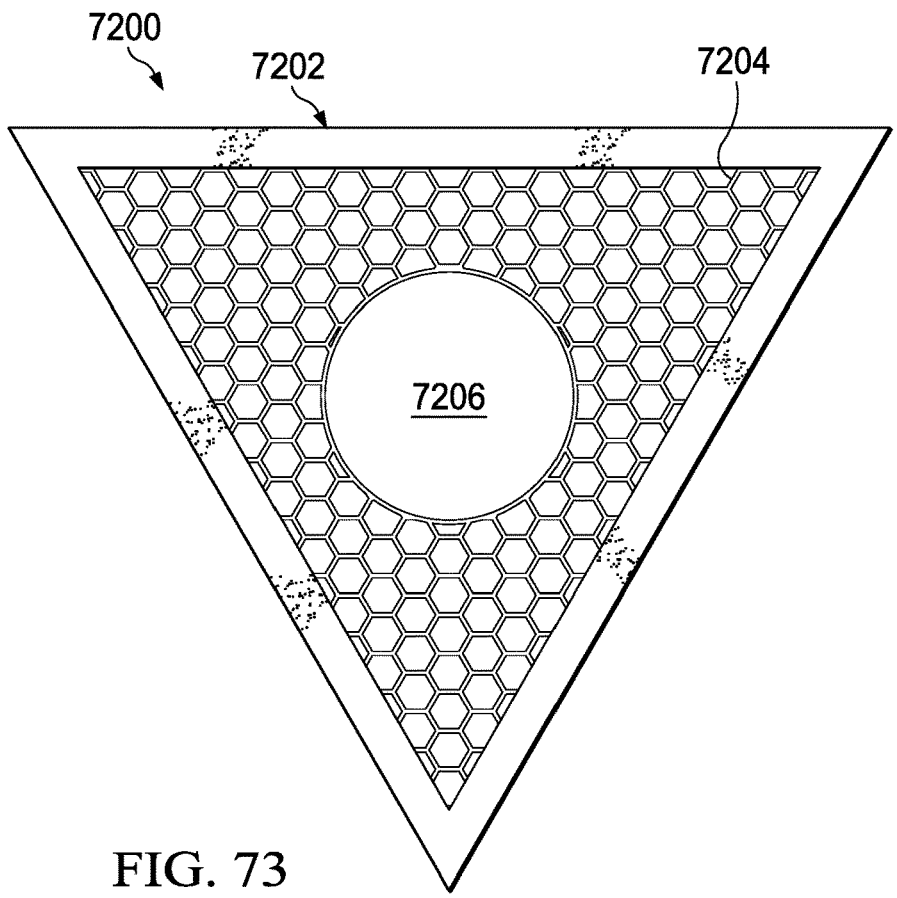
FIG. 73 is a diagram of a front view of a triangular gasket with an I-beam structure and a circular penetration, in accordance with an example embodiment of the present disclosure.

FIG. 73 is a diagram of a front view of triangular gasket 7200 with an I-beam structure and a circular penetration, in accordance with an example embodiment of the present disclosure.

Figure 74:
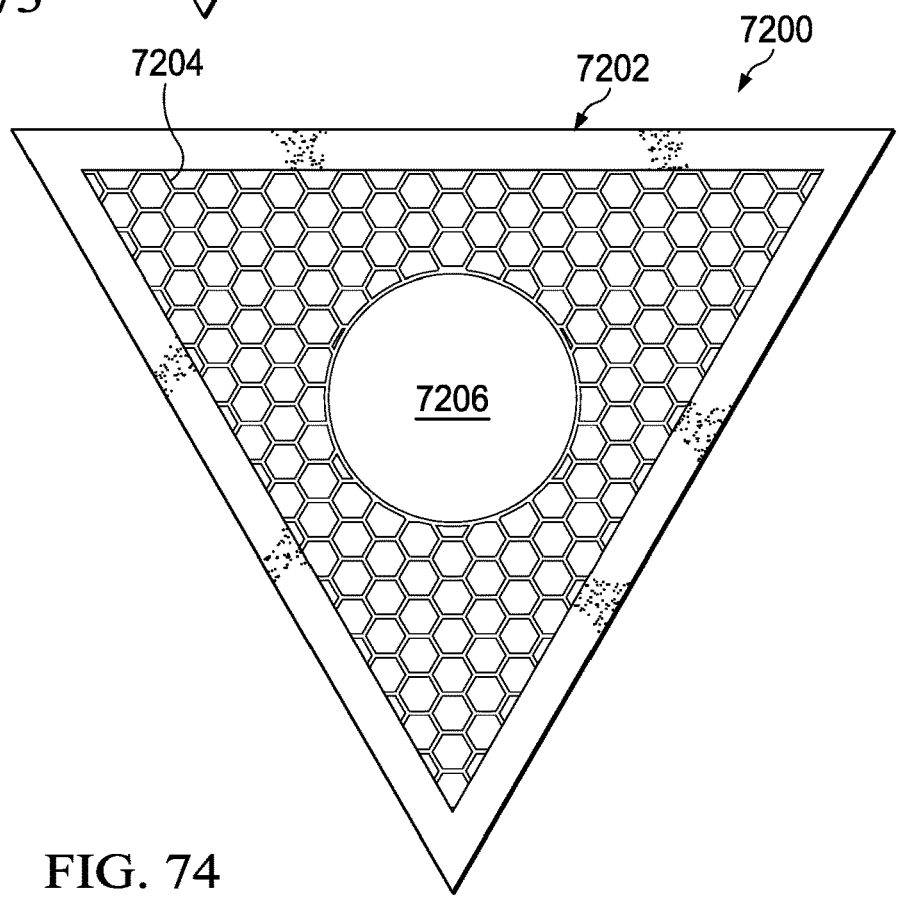
FIG. 74 is a diagram of a rear view of a triangular gasket with an I-beam structure and a circular penetration, in accordance with an example embodiment of the present disclosure.

FIG. 74 is a diagram of a rear view of triangular gasket 7200 with an I-beam structure and a circular penetration, in accordance with an example embodiment of the present disclosure.

Figure 75:
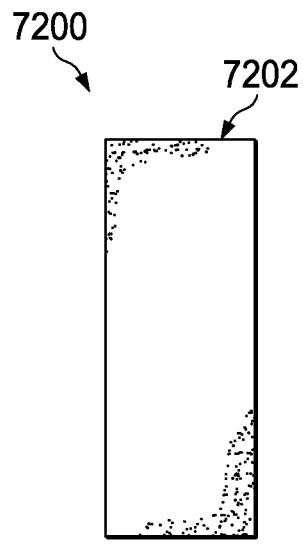
FIG. 75 is a diagram of a right view of a triangular gasket with an I-beam structure and a circular penetration, in accordance with an example embodiment of the present disclosure.

FIG. 75 is a diagram of a right view of triangular gasket 7200 with an I-beam structure and a circular penetration, in accordance with an example embodiment of the present disclosure.

Figure 76:
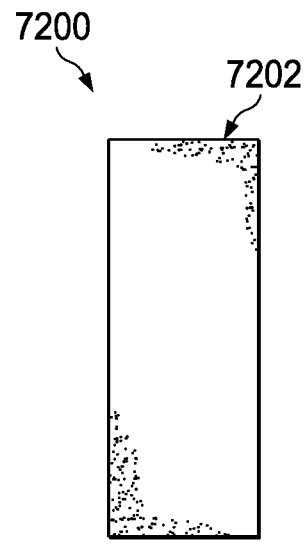
FIG. 76 is a diagram of a left view of a triangular gasket with an I-beam structure and a circular penetration, in accordance with an example embodiment of the present disclosure.

FIG. 76 is a diagram of a left view of triangular gasket 7200 with an I-beam structure and a circular penetration, in accordance with an example embodiment of the present disclosure.

Figure 77:
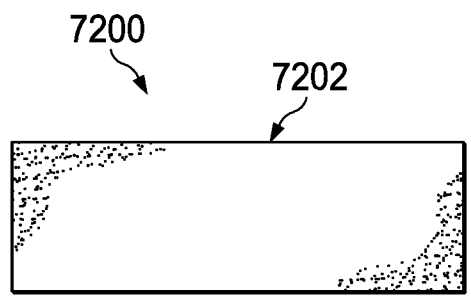
FIG. 77 is a diagram of a top view of a triangular gasket with an I-beam structure and a circular penetration, in accordance with an example embodiment of the present disclosure.

FIG. 77 is a diagram of a top view of triangular gasket 7200 with an I-beam structure and a circular penetration, in accordance with an example embodiment of the present disclosure.

Figure 78:
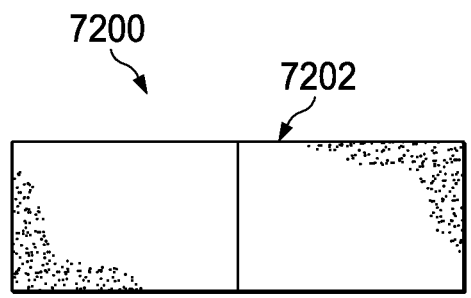
FIG. 78 is a diagram of a bottom view of a triangular gasket with an I-beam structure and a circular penetration, in accordance with an example embodiment of the present disclosure.

FIG. 78 is a diagram of a bottom view of triangular gasket 7200 with an I-beam structure and a circular penetration, in accordance with an example embodiment of the present disclosure.

Figure 79:
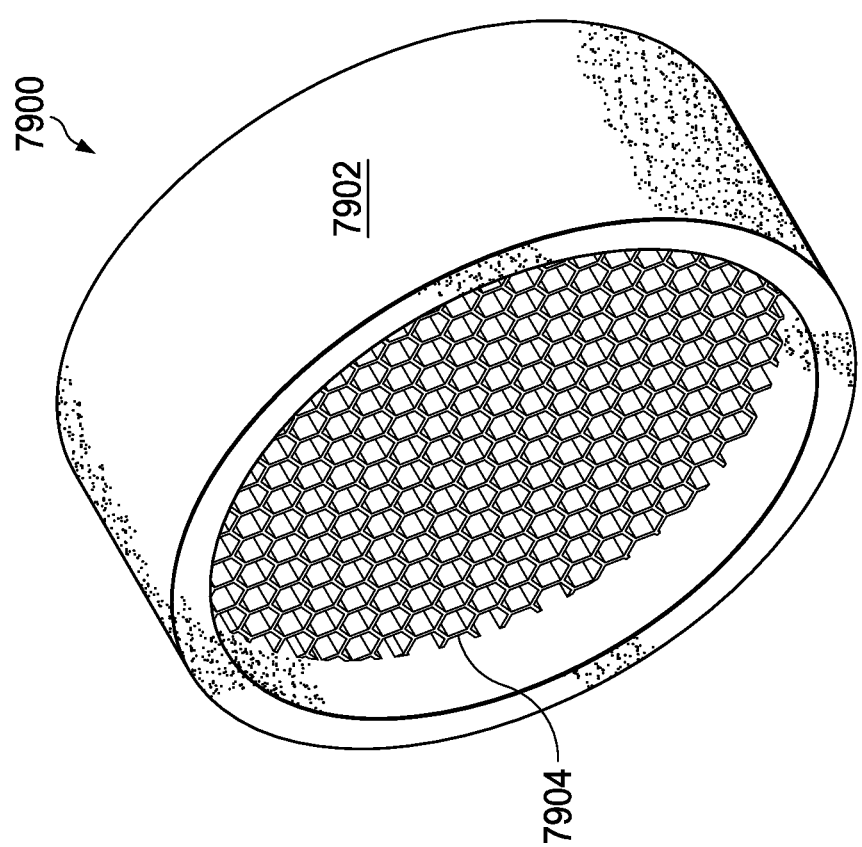
FIG. 79 is a diagram of an isometric view of a circular gasket with an I-beam structure, in accordance with an example embodiment of the present disclosure.

FIG. 79 is a diagram of an isometric view of a circular gasket 7900 with an I-beam structure, in accordance with an example embodiment of the present disclosure. While a circular shape is shown, any other suitable circular or irregular shape can also or alternatively be used, such as ovals, ellipsoids, oblong shapes and so forth, as well as shapes that are combinations of partial components of such shapes. Gasket 7900 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 7900 includes I beam body 7902 and honeycomb fill 7904, as well as surfaces similar to those of gasket 100. In addition, suitable modifications can be made to gasket 7900 as with gasket 100, such as to have all rounded corners, all square corners, different corner shapes, a combination of corner shapes, thicker or thinner edges, thicker or thinner fill, longer or shorter sides, one or more additional sides, curved or irregular shaped sides, a penetration or penetrations of other shapes, or other suitable modifications. Gasket 7900 can be secured in position with glue, cement, rivets, bolts, clasps or other suitable devices (not explicitly shown).

Figure 80:
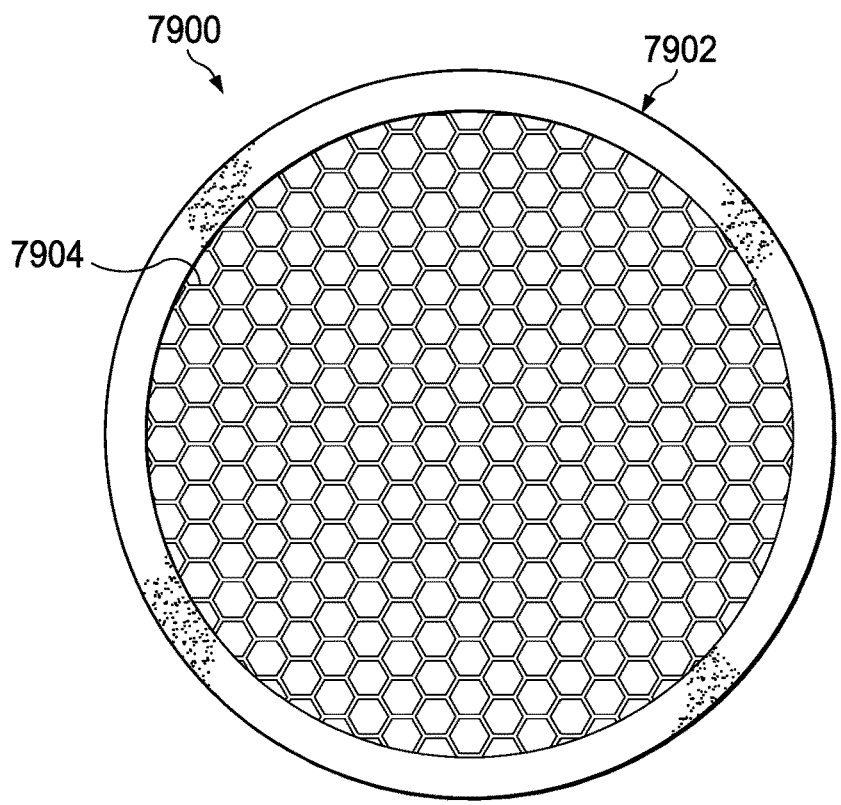
FIG. 80 is a diagram of a front view of a circular gasket with an I-beam structure, in accordance with an example embodiment of the present disclosure.

FIG. 80 is a diagram of a front view of circular gasket 7900 with an I-beam structure, in accordance with an example embodiment of the present disclosure.

Figure 81:
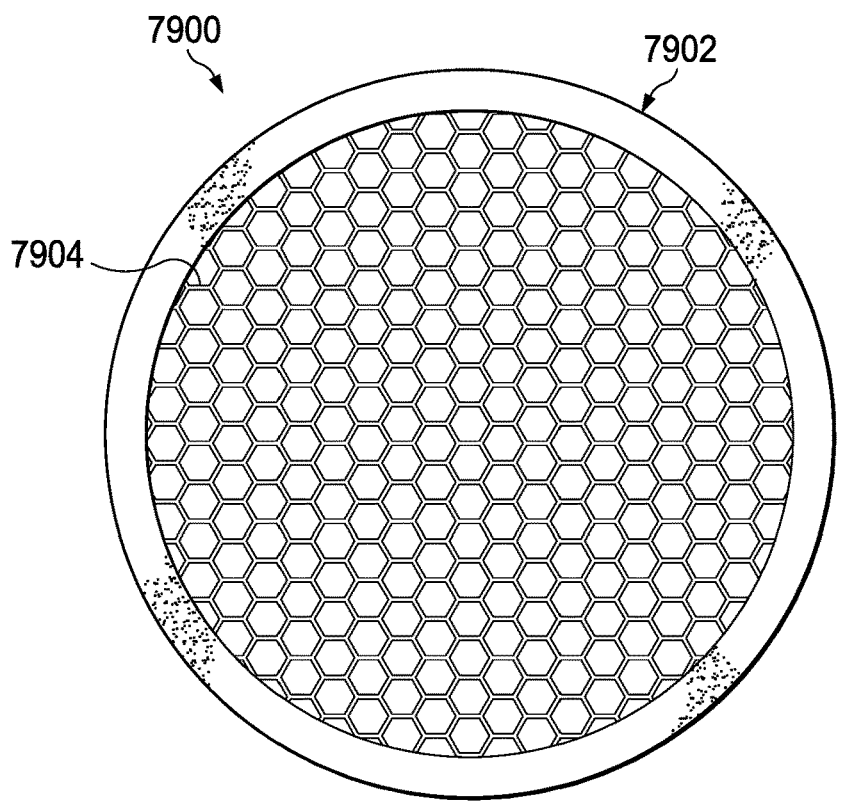
FIG. 81 is a diagram of a rear view of a circular gasket with an I-beam structure, in accordance with an example embodiment of the present disclosure.

FIG. 81 is a diagram of a rear view of circular gasket 7900 with an I-beam structure, in accordance with an example embodiment of the present disclosure.

Figure 82:
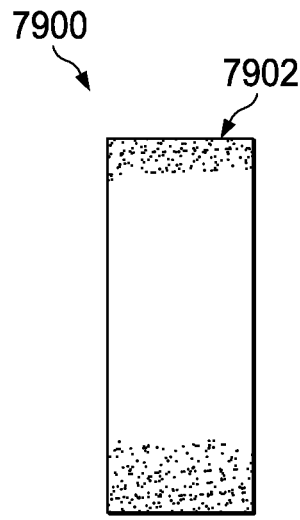
FIG. 82 is a diagram of a right view of a circular gasket with an I-beam structure, in accordance with an example embodiment of the present disclosure.

FIG. 82 is a diagram of a right view of circular gasket 7900 with an I-beam structure, in accordance with an example embodiment of the present disclosure.

Figure 83:
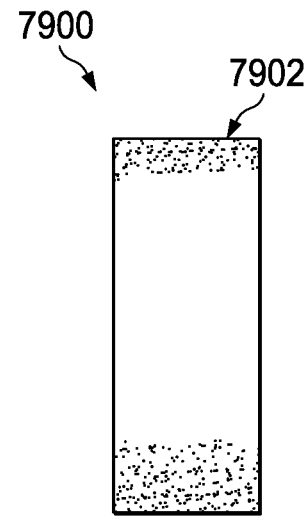
FIG. 83 is a diagram of a left view of a circular gasket with an I-beam structure, in accordance with an example embodiment of the present disclosure.

FIG. 83 is a diagram of a left view of circular gasket 7900 with an I-beam structure, in accordance with an example embodiment of the present disclosure.

Figure 84:
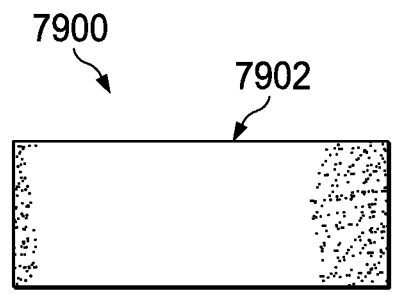
FIG. 84 is a diagram of a top view of a circular gasket with an I-beam structure, in accordance with an example embodiment of the present disclosure.

FIG. 84 is a diagram of a top view of circular gasket 7900 with an I-beam structure, in accordance with an example embodiment of the present disclosure.

Figure 85:
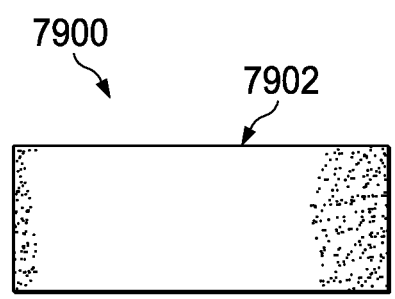
FIG. 85 is a diagram of a bottom view of a circular gasket with an I-beam structure, in accordance with an example embodiment of the present disclosure.

FIG. 85 is a diagram of a bottom view of circular gasket 7900 with an I-beam structure, in accordance with an example embodiment of the present disclosure.

Figure 86:
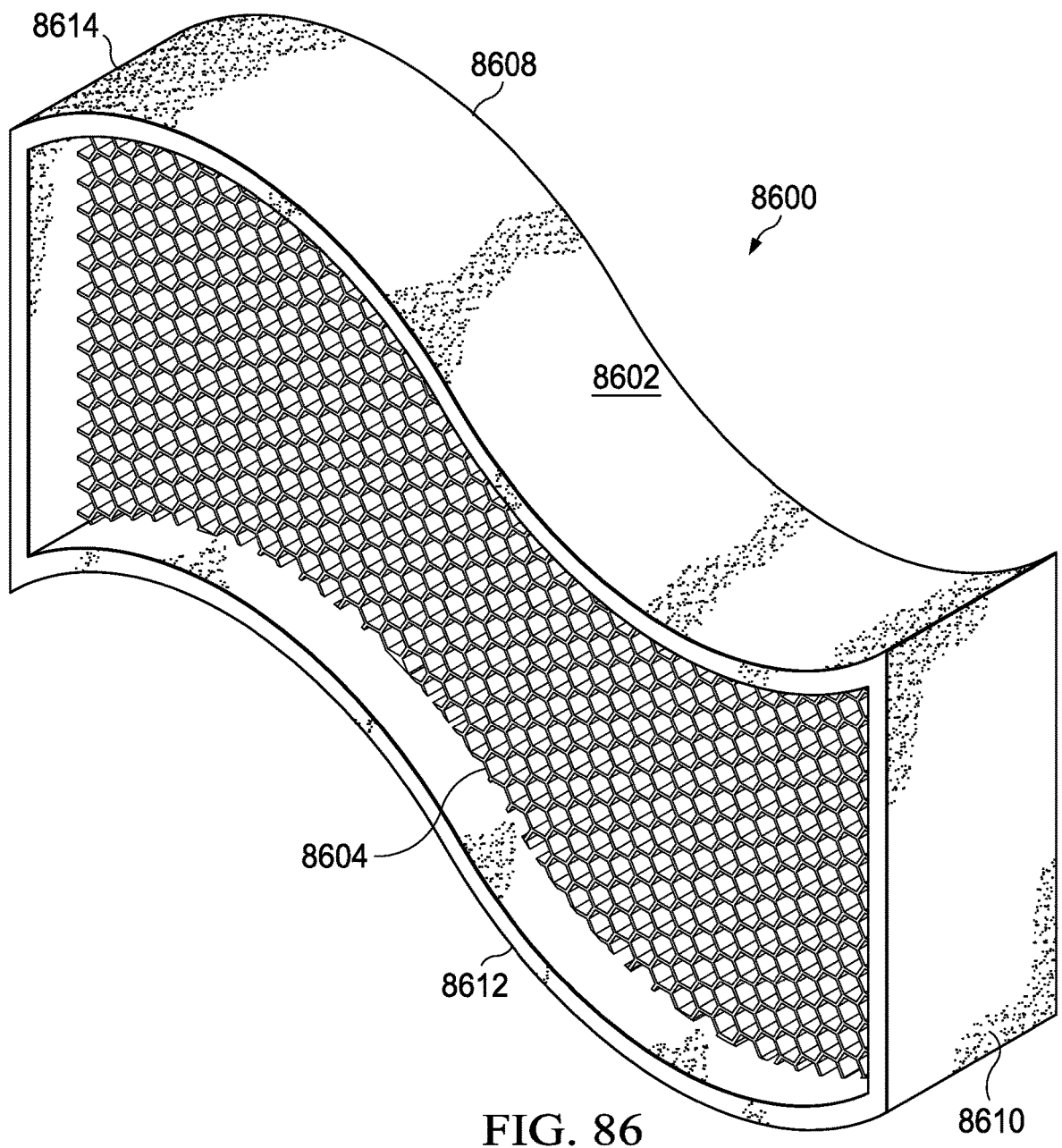
FIG. 86 is a diagram of an isometric view of an irregular gasket with an I-beam structure, in accordance with an example embodiment of the present disclosure.

FIG. 86 is a diagram of an isometric view of an irregular gasket 8600 with an I-beam structure, in accordance with an example embodiment of the present disclosure. While an irregular gasket shape is shown, any other suitable irregular shape can also or alternatively be used, such as shapes with sharp and curved edges, shapes with unmatched sides and so forth, as well as shapes that are combinations of partial components of such shapes. Gasket 8600 can be formed from solid or sponge rubber, elastomeric, polymer, fluoroelastomer, neoprene, styrene, polyester, silicone, other suitable materials, or a suitable combination of these materials, by injection molding, expansion molding, punching, extrusion, casting, die cutting or other suitable processes. Gasket 8600 includes I beam body 8602, honeycomb fill 8604, top surface 8608, side surface 8610, bottom surface 8612 and side surface 8614, as well as surfaces similar to those of gasket 100. In addition, suitable modifications can be made to gasket 8600 as with gasket 100, such as to have all rounded corners, all square corners, different corner shapes, a combination of corner shapes, thicker or thinner edges, thicker or thinner fill, longer or shorter sides, one or more additional sides, curved or irregular shaped sides, a penetration or penetrations of other shapes, or other suitable modifications. Gasket 8600 can be secured in position with glue, cement, rivets, bolts, clasps or other suitable devices (not explicitly shown).

Figure 87:
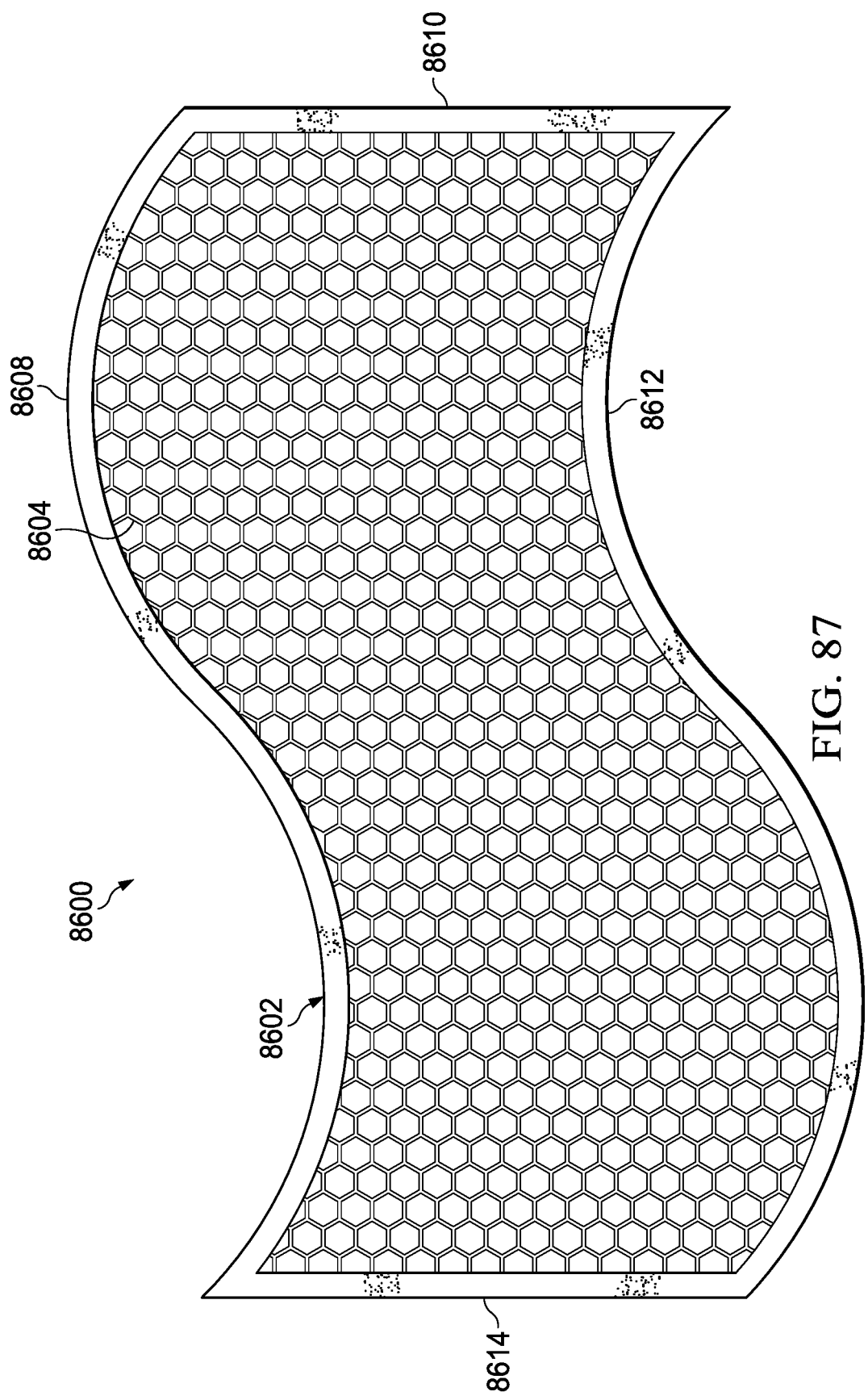
FIG. 87 is a diagram of a front view of an irregular gasket with an I-beam structure, in accordance with an example embodiment of the present disclosure.

FIG. 87 is a diagram of a front view irregular gasket 8600 with an I-beam structure, in accordance with an example embodiment of the present disclosure.

Figure 88:
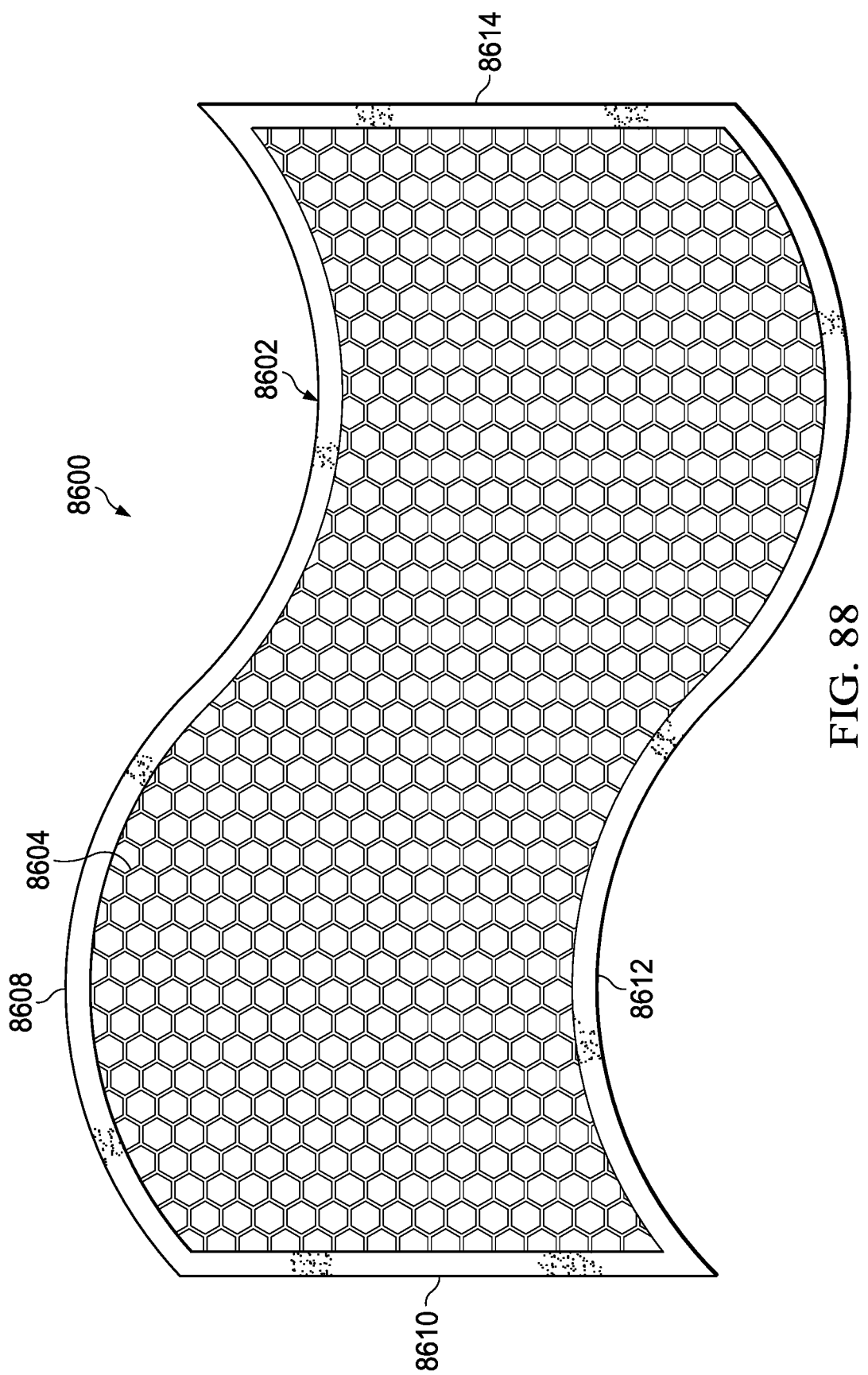
FIG. 88 is a diagram of a rear view of an irregular gasket with an I-beam structure, in accordance with an example embodiment of the present disclosure.

FIG. 88 is a diagram of a rear view of an irregular gasket with an I-beam structure, in accordance with an example embodiment of the present disclosure.

Figure 89:
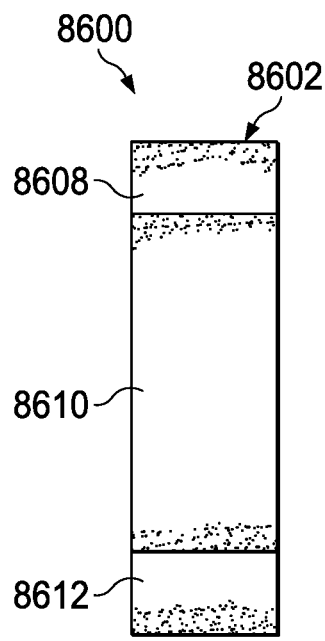
FIG. 89 is a diagram of a right view of an irregular gasket with an I-beam structure, in accordance with an example embodiment of the present disclosure.

FIG. 89 is a diagram of a right view of irregular gasket 8600 with an I-beam structure, in accordance with an example embodiment of the present disclosure.

Figure 90:
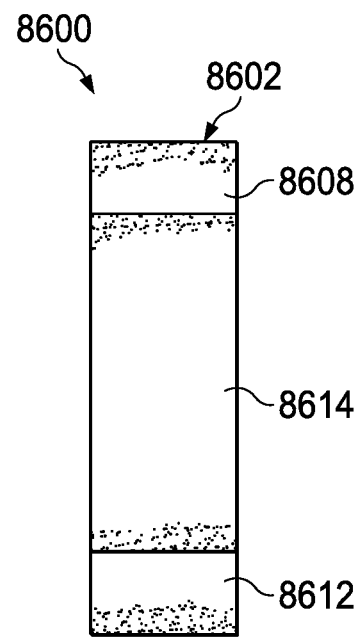
FIG. 90 is a diagram of a left view of an irregular gasket with an I-beam structure, in accordance with an example embodiment of the present disclosure.

FIG. 90 is a diagram of a left view of an irregular gasket with an I-beam structure, in accordance with an example embodiment of the present disclosure.

Figure 91:
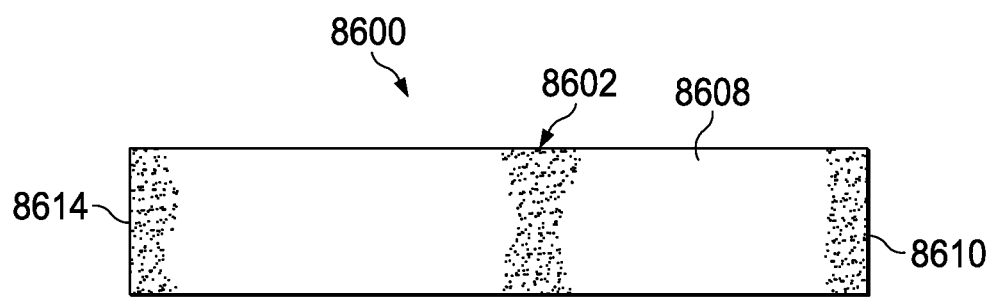
FIG. 91 is a diagram of a top view of an irregular gasket with an I-beam structure, in accordance with an example embodiment of the present disclosure.

FIG. 91 is a diagram of a top view of irregular gasket 8600 with an I-beam structure, in accordance with an example embodiment of the present disclosure.

Figure 92:
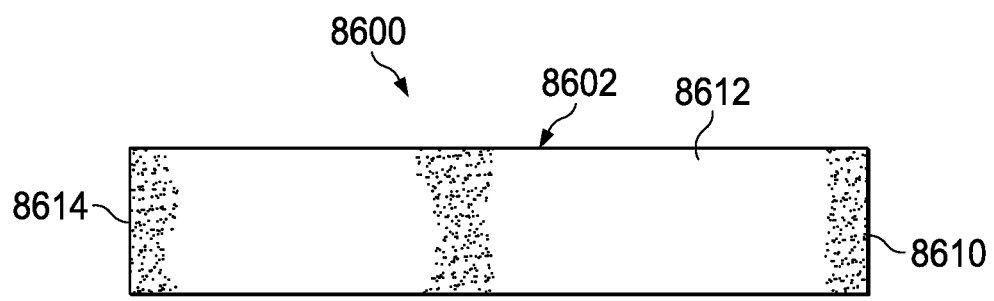
FIG. 92 is a diagram of a bottom view of an irregular gasket with an I-beam structure, in accordance with an example embodiment of the present disclosure.

FIG. 92 is a diagram of a bottom view of irregular gasket 8600 with an I-beam structure, in accordance with an example embodiment of the present disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A gasket comprising:
a flexible elastomeric edge structure configured to allow deformation in an axial, radial or warping displacement; and
a honeycomb structure surrounded by the edge structure, wherein the elastomeric edge structure and the honeycomb structure surrounded by the elastomeric edge structure are part of the gasket, have an elongated shape and are formed using a non-metallic molding process, and the elastomeric edge structure includes a plurality of buttons extending outside of a circumference of the elastomeric edge structure and configured to secure the gasket to an assembly.

2. The gasket of claim 1 wherein the elastomeric edge structure comprises an I-beam structure extending along a circumference of the gasket.

3. The gasket of claim 1 wherein the elastomeric edge structure comprises a flat portion having a width greater than a thickness of the honeycomb structure.

4. The gasket of claim 1 wherein the elastomeric edge structure has a width greater than a thickness of the honeycomb structure.

5. The gasket of claim 1 wherein the elastomeric edge structure comprises an I beam body that extends along an entire outer boundary of the gasket.

6. The gasket of claim 5 wherein the I beam body has an outer surface has a width W and forms a right angle.

7. The gasket of claim 6 wherein the I beam body has a thickness T, where T is less than W and forms two right angles.

8. The gasket of claim 7 wherein a relative ratio of W to T is greater than 2:1 and less than 100:1 and forms a right angle and a curved corner.

9. The gasket of claim 1 wherein the honeycomb structure is elastomeric and has a width and length that extends to the elastomeric edge structure.

10. The gasket of claim 1 further comprising a single penetration disposed in the honeycomb structure at a location other than a center of the gasket, the single penetration containing one or more electrical cables within a complex electrical assembly.

11. The gasket of claim 1 wherein the honeycomb structure has a uniform thickness and a penetration with at least one angle.

12. The gasket of claim 1 wherein the honeycomb structure has a thickness that is less than a width of the elastomeric edge structure and is disposed within a gap in a complex electrical assembly.

13. The gasket of claim 1 wherein the honeycomb structure has a thickness that is less than a thickness of the elastomeric edge structure.

14. The gasket of claim 1 wherein the elastomeric edge structure and the honeycomb structure surrounded by the elastomeric edge structure are part of the gasket and include two curved corners.

15. The gasket of claim 1 wherein the elastomeric edge structure and the honeycomb structure surrounded by the elastomeric edge structure are part of the gasket and form a continuous construction.

16. The gasket of claim 1 wherein the elastomeric edge structure and the honeycomb structure surrounded by the elastomeric edge structure are part of the gasket, are disposed in a gap in electrical equipment and are formed using a molding process.

17. The gasket of claim 1 wherein the elastomeric edge structure and the honeycomb structure surrounded by the elastomeric edge structure are part of the gasket and are formed using a non-metallic molding process.

18. The gasket of claim 1 wherein the elastomeric edge structure and the honeycomb structure surrounded by the elastomeric edge structure are part of the gasket, have an elongated shape and are formed using a non-metallic molding process and have a plurality of penetrations.

19. The gasket of claim 1 wherein the elastomeric edge structure and the honeycomb structure surrounded by the elastomeric edge structure are part of the gasket and are formed using a non-metallic molding process, and include a plurality of penetrations that are offset from a center of the gasket.

* * * * *